United States Patent
Todd et al.

(10) Patent No.: US 7,297,641 B2
(45) Date of Patent: *Nov. 20, 2007

(54) METHOD TO FORM ULTRA HIGH QUALITY SILICON-CONTAINING COMPOUND LAYERS

(75) Inventors: Michael A. Todd, Phoenix, AZ (US); Keith D. Weeks, Mesa, AZ (US); Christiaan J. Werkhoven, Tempe, AZ (US); Christophe F. Pomarede, Phoeniz, AZ (US)

(73) Assignee: ASM America, Inc., Phoenix, AZ (US)

( * ) Notice: Subject to any disclaimer, the term of this patent is extended or adjusted under 35 U.S.C. 154(b) by 50 days.

This patent is subject to a terminal disclaimer.

(21) Appl. No.: 10/623,482

(22) Filed: Jul. 18, 2003

(65) Prior Publication Data

US 2005/0118837 A1   Jun. 2, 2005

Related U.S. Application Data

(60) Provisional application No. 60/397,576, filed on Jul. 19, 2002.

(51) Int. Cl.
*H01L 21/31* (2006.01)
*H01L 21/469* (2006.01)

(52) U.S. Cl. ............. 438/763; 438/775; 438/786; 438/791; 257/E21.192; 257/E21.267; 257/E21.268; 257/E21.293

(58) Field of Classification Search ............. 438/763, 438/775, 786, 791; 257/E21.192, E21.267, 257/E21.268

See application file for complete search history.

(56) References Cited

U.S. PATENT DOCUMENTS

| 4,262,631 A | 4/1981 | Kubacki |
| 4,277,320 A | 7/1981 | Beguwala et al. |
| 4,298,629 A | 11/1981 | Nozaki et al. |
| 4,363,828 A * | 12/1982 | Brodsky et al. ............ 438/485 |
| 4,495,218 A | 1/1985 | Azuma et al. |
| 4,585,671 A | 4/1986 | Kitagawa et al. |
| 4,610,859 A | 9/1986 | Miyagawa et al. |

(Continued)

FOREIGN PATENT DOCUMENTS

| GB | 2 298 313 A | 8/1996 |
| JP | 57209810 A | 12/1982 |
| JP | 59078918 A | 5/1984 |
| JP | 59078919 A | 5/1984 |
| JP | 60043485 A | 3/1985 |

(Continued)

OTHER PUBLICATIONS

Ikoma et al., Growth of Si/3C-SiC/Si(100) hetrostructures by pulsed supersonic free jets, Applied Physics Letters, vol. 75, No. 25, pp. 3977-3979, Dec. 1999.

(Continued)

*Primary Examiner*—Michael Lebentritt
*Assistant Examiner*—Ron Pompey
(74) *Attorney, Agent, or Firm*—Knobbe Martens Olson & Bear LLP

(57) ABSTRACT

Multiple sequential processes are conducted in a reaction chamber to form ultra high quality silicon-containing compound layers, including silicon nitride layers. In a preferred embodiment, a silicon layer is deposited on a substrate using trisilane as the silicon precursor. A silicon nitride layer is then formed by nitriding the silicon layer. By repeating these steps, a silicon nitride layer of a desired thickness is formed.

20 Claims, 13 Drawing Sheets

U.S. PATENT DOCUMENTS

| | | | |
|---|---|---|---|
| 4,684,542 A | 8/1987 | Jasinski et al. | |
| 4,715,937 A | 12/1987 | Moslehi et al. | |
| 4,720,395 A | 1/1988 | Foster | |
| 4,834,020 A | 5/1989 | Bartholomew et al. | |
| 4,851,095 A | 7/1989 | Scobey et al. | |
| 4,891,103 A | 1/1990 | Zorinsky et al. | |
| 5,227,329 A | 7/1993 | Kobayashi et al. | |
| 5,389,398 A | 2/1995 | Suzuki et al. | 427/130 |
| 5,389,570 A | 2/1995 | Shiozawa | |
| 5,453,858 A | 9/1995 | Yamazaki | |
| 5,607,724 A | 3/1997 | Beinglass et al. | |
| 5,614,257 A | 3/1997 | Beinglass et al. | |
| 5,648,293 A | 7/1997 | Hayama et al. | |
| 5,656,531 A | 8/1997 | Thakur et al. | |
| 5,695,819 A | 12/1997 | Beinglass et al. | |
| 5,698,771 A | 12/1997 | Shields et al. | 73/31.05 |
| 5,700,520 A | 12/1997 | Beinglass et al. | |
| 5,786,027 A | 7/1998 | Rolfson | |
| 5,789,030 A | 8/1998 | Rolfson | |
| 5,837,580 A | 11/1998 | Thakur et al. | |
| 5,874,129 A | 2/1999 | Beinglass et al. | |
| 5,876,797 A | 3/1999 | Beinglass et al. | |
| 5,885,869 A | 3/1999 | Turner et al. | |
| 5,907,792 A | 5/1999 | Droopad et al. | |
| 5,916,365 A | 6/1999 | Sherman | |
| 6,015,590 A | 1/2000 | Suntola et al. | |
| 6,027,705 A | 2/2000 | Kitsuno et al. | |
| 6,056,823 A * | 5/2000 | Sajoto et al. | 118/715 |
| 6,083,810 A | 7/2000 | Obeng et al. | |
| 6,087,229 A * | 7/2000 | Aronowitz et al. | 438/287 |
| 6,136,654 A | 10/2000 | Kraft et al. | |
| 6,159,828 A | 12/2000 | Ping et al. | 438/486 |
| 6,171,662 B1 | 1/2001 | Nakao | 427/595 |
| 6,197,669 B1 | 3/2001 | Twu et al. | 438/585 |
| 6,197,694 B1 | 3/2001 | Beinglass | |
| 6,200,893 B1 | 3/2001 | Sneh | |
| 6,228,181 B1 | 5/2001 | Yamamoto et al. | 148/33.5 |
| 6,252,295 B1 * | 6/2001 | Cote et al. | 257/635 |
| 6,271,054 B1 * | 8/2001 | Ballantine et al. | 438/60 |
| 6,326,311 B1 | 12/2001 | Ueda et al. | 438/694 |
| 6,391,803 B1 | 5/2002 | Kim et al. | |
| 6,455,892 B1 | 9/2002 | Okuno et al. | 257/328 |
| 6,468,924 B2 | 10/2002 | Lee et al. | |
| 6,503,846 B1 * | 1/2003 | Niimi et al. | 438/776 |
| 6,528,530 B2 | 3/2003 | Zeitlin et al. | |
| 6,537,910 B1 | 3/2003 | Burke et al. | |
| 6,589,868 B2 | 7/2003 | Rossman | |
| 6,613,695 B2 | 9/2003 | Pomarede et al. | 438/767 |
| 6,638,879 B2 | 10/2003 | Hsieh et al. | |
| 6,824,816 B2 * | 11/2004 | Aaltonen et al. | 427/124 |
| 7,005,392 B2 * | 2/2006 | Baum et al. | 438/785 |
| 7,125,582 B2 | 10/2006 | McSwiney et al. | |
| 7,172,792 B2 | 2/2007 | Wang et al. | |
| 7,192,626 B2 | 3/2007 | Dussarrat et al. | |
| 2001/0032986 A1 | 10/2001 | Miyasaka | |
| 2002/0047151 A1 * | 4/2002 | Kim et al. | 257/301 |
| 2002/0073925 A1 * | 6/2002 | Noble et al. | 118/723 ME |
| 2002/0098627 A1 | 7/2002 | Pomarede et al. | 438/149 |
| 2002/0168868 A1 | 11/2002 | Todd | 438/767 |
| 2002/0197831 A1 | 12/2002 | Todd et al. | 438/528 |
| 2003/0022528 A1 | 1/2003 | Todd | 438/933 |
| 2003/0059535 A1 * | 3/2003 | Luo et al. | 427/255.28 |
| 2003/0082300 A1 | 5/2003 | Todd et al. | 427/255.27 |
| 2004/0096582 A1 | 5/2004 | Wang et al. | |
| 2005/0080286 A1 | 4/2005 | Wang et al. | |
| 2006/0084283 A1 | 4/2006 | Paranjpe et al. | |

FOREIGN PATENT DOCUMENTS

| | | |
|---|---|---|
| JP | S60-43485 | 3/1985 |
| JP | 61153277 A | 7/1986 |
| JP | 62076612 A | 4/1987 |
| JP | 63003414 A | 1/1988 |
| JP | 63003463 A | 1/1988 |
| JP | 01217956 A | 8/1989 |
| JP | 01268064 A | 10/1989 |
| JP | 02155225 A | 6/1990 |
| JP | H 02-155225 | 6/1990 |
| JP | 03091239 A | 4/1991 |
| JP | H3-91239 | 4/1991 |
| JP | 03185817 A | 8/1991 |
| JP | 03187215 A | 8/1991 |
| JP | H3-185817 | 8/1991 |
| JP | H3-187215 | 8/1991 |
| JP | 03292741 A | 12/1991 |
| JP | 04323834 A | 11/1992 |
| JP | 05021378 A | 1/1993 |
| JP | 05062911 A | 3/1993 |
| JP | H5-62911 | 3/1993 |
| JP | 07249618 A | 9/1995 |
| JP | 08242006 A | 9/1996 |
| WO | WO 02/064853 A2 | 8/2002 |

OTHER PUBLICATIONS

Iyer, R. Suryanarayanan et al., "A process Method of Silicon Nitride Atomic Layer Cyclic Deposition," *Semicon Taiwan 2001*, pp. 17-25.

International Search Report and Written Opinion for International Application No. PCT/US2006/047805. May 8, 2007.

Ishihara et al., "Low-temperature chemical-vapor-deposition of silicon-nitride, from tetra-silane and hydrogen azide," *Materials Research Society Symposium Proceedings*, vol. 284, p. 3-8 (1993).

Kanoh et al., "Low-temperature chemical-vapor-deposition of silicon nitride," *Journal de Physique IV*, vol. 2, p. C2-831-C2-837 (1991).

Yeh et al., "Low-temperature chemical-vapor-deposition of silicon-nitride film from hexachloro-disilane and hydrazine," *Jpn. J. Appl. Phys.* vol. 35, Part 1, No. 2B, p. 1509-1512 (Feb. 1996).

* cited by examiner

METHOD TO FORM ULTRA HIGH QUALITY SILICON-CONTAINING COMPOUND LAYERS

REFERENCE TO RELATED APPLICATIONS

This application claims the priority benefit of U.S. Provisional Application Ser. No. 60/397,576, METHOD TO FORM ULTRA HIGH QUALITY SILICON-CONTAINING LAYERS, filed Jul. 19, 2002. This application is also related to U.S. application Ser. No. 10/074,564, THIN FILMS AND METHODS OF MAKING THEM, filed Feb. 11, 2002, and Ser. No. 10/074,563, IMPROVED PROCESS FOR DEPOSITION OF SEMICONDUCTOR FILMS, filed Feb. 11, 2002, both of which are hereby incorporated by reference in their entirety.

FIELD OF THE INVENTION

This invention relates generally to forming silicon-containing layers during integrated circuit fabrication and, more particularly, to methods for forming uniform silicon compound layers.

BACKGROUND OF THE INVENTION

As the dimensions of microelectronic devices become smaller, the physical characteristics of the deposited layers, including uniformity in thickness, composition, and coverage, become more important. This is particularly true of the layers, or films, of silicon compounds that can act as dielectrics or insulators to separate conductive elements of an integrated circuit. For example, silicon nitride materials are widely used in the semiconductor industry as transistor gate dielectrics, insulators between metal levels, barriers to prevent oxidation and other diffusion, hard masks, passivation layers, spacer materials in transistors, anti-reflective coating materials, layers in non-volatile memories, etc. Silicon oxide and silicon carbide materials are similarly common in integrated circuit fabrication.

Currently, chemical vapor deposition (CVD) is the most commonly used process for deposition of thin layers on a substrate. With this process, precursors for molecules or atoms that will ultimately form the deposited layer are fed simultaneously into a reaction chamber as molecular precursors. The substrate is kept at a temperature that is optimized to promote chemical reaction between the molecular precursors so that a layer of the desired atomic or molecular species is deposited on the substrate. The most common molecular precursor for forming silicon-containing thin layers by conventional CVD has been silane.

CVD has proven to have a superior ability to deposit layers with relatively uniform thicknesses. In addition, it produces relatively conformal layers, i.e., layers that closely replicate the shape of the surface on which they are being deposited. However, as device density continues to increase and geometries continue to become more complicated, deposition processes have been further refined to meet the need for even more uniform and conformal layers.

For these reasons, atomic layer deposition (ALD) has become more prominent in semiconductor fabrication. ALD typically involves multiple deposition cycles, with each cycle depositing a thin layer. ALD seeks to deposit perfectly conformal and uniform layers by depositing no more than a single monolayer during each cycle. Typically, this is accomplished by use of a self-terminating precursor molecule and optimizing conditions to avoid condensation and thermal decomposition of the precursors. For example, to deposit a layer of a titanium compound, a titanium precursor molecule such as $TiCl_4$ can be used. With $TiCl_4$, the titanium atom attaches to the surface of the substrate while chlorine atoms terminate the adsorbed layer on the side of the titanium atom opposite the substrate surface. As a result, once the substrate surface is covered with a monolayer of the titanium molecule, the top of the titanium layer will comprise chlorine atoms which are relatively inert and cause the adsorption process to self-terminate.

In contrast to CVD, ALD molecular precursors used to produce a compound layer, i.e., a layer comprising two or more elements, are typically introduced into the ALD reactor in separate pulses. For example, a first precursor self-limitingly adsorbs on the substrate in a first pulse, with ligands of the adsorbed species preventing further adsorption. Between introduction of precursors, the reaction chamber is evacuated or purged with inert gas to prevent gas phase reactions between the different precursors. After purging of the first precursor, a second precursor can be introduced into the reaction chamber to react with the layer deposited by introduction of the first precursor, e.g., to strip the ligands or to replace the ligands. In this way, one cycle is completed and one thin compound layer is deposited on a substrate. After reaction with the second precursor, the second precursor (and any byproduct) can be removed by evacuation or inert gas purging. In addition to these precursors, other reactants can also be pulsed into the reaction chamber during each cycle. The cycle can then be repeated until a compound layer of a desired thickness is reached.

While ALD gives superior conformality and uniformity in comparison to CVD, ALD is relatively inefficient in terms of speed. Because a layer of a desired thickness must, in theory, be formed one molecular monolayer at a time (in actuality, less than one molecular monolayer is typical, due to the blocking of reactive sites as a result of steric hindrance), and because multiple steps must be employed to form each monolayer, ALD forms a layer with a given thickness more slowly than does CVD. Consequently, while conformality and uniformity is increased, ALD has the drawback of having decreased throughput in comparison to CVD.

Nevertheless, high conformality and uniformity are important considerations as semiconductor fabrication currently involves depositing silicon-containing compound films during the process of making thousands or even millions of devices simultaneously on a substrate that is 200 millimeters (mm) in diameter. Moreover, the industry is transitioning to 300 mm wafers, and can use even larger wafers in the future. In addition, even larger substrates, in the form of flat panel displays, etc., are becoming increasingly common. Significant variations in the thickness and/or composition of the silicon-containing compound films during the manufacturing process can lead to lower manufacturing yields when the affected devices do not meet the required performance specifications. Also, variations across the film within a particular device can reduce device performance and/or reliability. Thus, as substrate sizes increase to accommodate manufacture of larger numbers of microelectronic devices on a circuit, the problems created by the shortcomings of conventional CVD processes also increase.

Consequently, due to the constant need for high throughput, the decreasing sizes of circuits in microelectronic devices and the increasing surface areas of substrates, there is a continuing need for methods for forming more uniform and conformal layers of silicon compounds, while also allowing for high throughput.

SUMMARY OF THE INVENTION

In accordance with one aspect of the invention, a method comprising a plurality of cycles is provided for forming a silicon-containing compound layer in an integrated circuit. Each cycle comprises depositing a silicon layer on a substrate in a process chamber by exposing the substrate to trisilane. The trisilane is substantially removed from the process chamber. The silicon layer is exposed to a reactive species to form a silicon-containing compound layer. The reactive species is substantially removed from the process chamber.

In accordance with another aspect of the invention, a method is provided for forming an insulating film. The method comprises loading a substrate into a reaction chamber. A silicon film is formed by exposing the substrate to a silicon source. The silicon source for forming a first silicon film on the substrate, after loading the substrate, is a polysilane. The silicon source is then substantially removed from the reaction chamber. The silicon film is exposed to a nitrogen source to form a silicon nitride film and the nitrogen source is then substantially removed from the reaction chamber.

In accordance with yet another aspect of the invention, a method is provided for forming a layer, of an insulating silicon compound, for an integrated circuit. The layer has a desired thickness and is formed by performing multiple chemical vapor deposition cycles in a reaction chamber. Each cycle comprises first, depositing a silicon layer on a substrate by exposing the substrate to a silicon source. The deposited silicon layer has a silicon layer thickness between about 3 Å and 25 Å. Second, the silicon layer is reacted to partially form the layer of an insulating silicon compound. The process temperature for reacting the silicon layer is less than about 650° C.

In accordance with another aspect of the invention, a process is provided for forming a silicon nitride layer on a substrate. The process comprises loading a substrate having a crystalline silicon surface into a single substrate laminar flow process chamber. As silicon layer is them formed on the crystalline silicon surface by decomposing a silicon source comprising a polysilane. By flowing a nitrogen source into the process chamber after forming the silicon layer, the silicon layer is nitrided to form a silicon nitride layer. Forming a silicon layer and nitriding the silicon layer are then repeated until a silicon nitride layer of between about 3 Å and 1000 Å thick results.

In accordance with yet another aspect of the invention, a method is provided for forming a silicon nitride film. The method comprises loading a substrate into a single substrate laminar flow reaction chamber and chemical vapor depositing a silicon layer on the substrate. The deposited silicon layer has a thickness non-uniformity of about 5% or less and a height of a top surface of the silicon layer over the substrate is greater than about a nitridation satuaration depth. The silicon layer is then nitrided.

In accordance with another aspect of the invention, an integrated circuit is provided. The integrated circuit comprises an insulating layer of a silicon compound over a substrate. The insulating layer has a thickness non-uniformity of about 10 percent or less and a hydrogen concentration of less than about 2 atomic percent.

BRIEF DESCRIPTION OF THE DRAWINGS

The invention will be better understood from the detailed description of the preferred embodiments and from the appended drawings, which are meant to illustrate and not to limit the invention, wherein like numerals refer to like structures throughout and wherein.

DETAILED DESCRIPTION OF THE PREFERRED EMBODIMENT

Preferred Reactor

While the preferred embodiments are presented in the context of a single-substrate, horizontal flow cold-wall reactor, it will be understood that certain aspects of the invention will have application to various types of reactors known in the art and that the invention is not limited to such a reactor. For examples, batch reactors can be used and advantageously allow for increased throughput due to the ability to simultaneously process a plurality of wafers. A suitable batch reactor is available commercially under the trade name A412™ from ASM International, N.V. of The Netherlands.

Nevertheless, use of a single-substrate, horizontal flow cold-wall reactor is particularly advantageous. For example, the illustrated single-pass horizontal flow design enables laminar flow of reactant gases, with low residence times, which in turn facilitates rapid sequential processing, particularly in the cyclical deposition process described below, while minimizing reactant interaction with each other and with chamber surfaces. Such a laminar flow enables sequentially flowing reactants that might react with each other. Reactions to be avoided include highly exothermic or explosive reactions, such as produced by oxygen and hydrogen-bearing reactants, and reactions that produce particulate contamination of the chamber. The skilled artisan will recognize, however, that for certain sequential processes, other reactor designs can also be provided for achieving these ends, provided sufficient purge or evacuation times are allowed to remove incompatible reactants.

Figure 1:
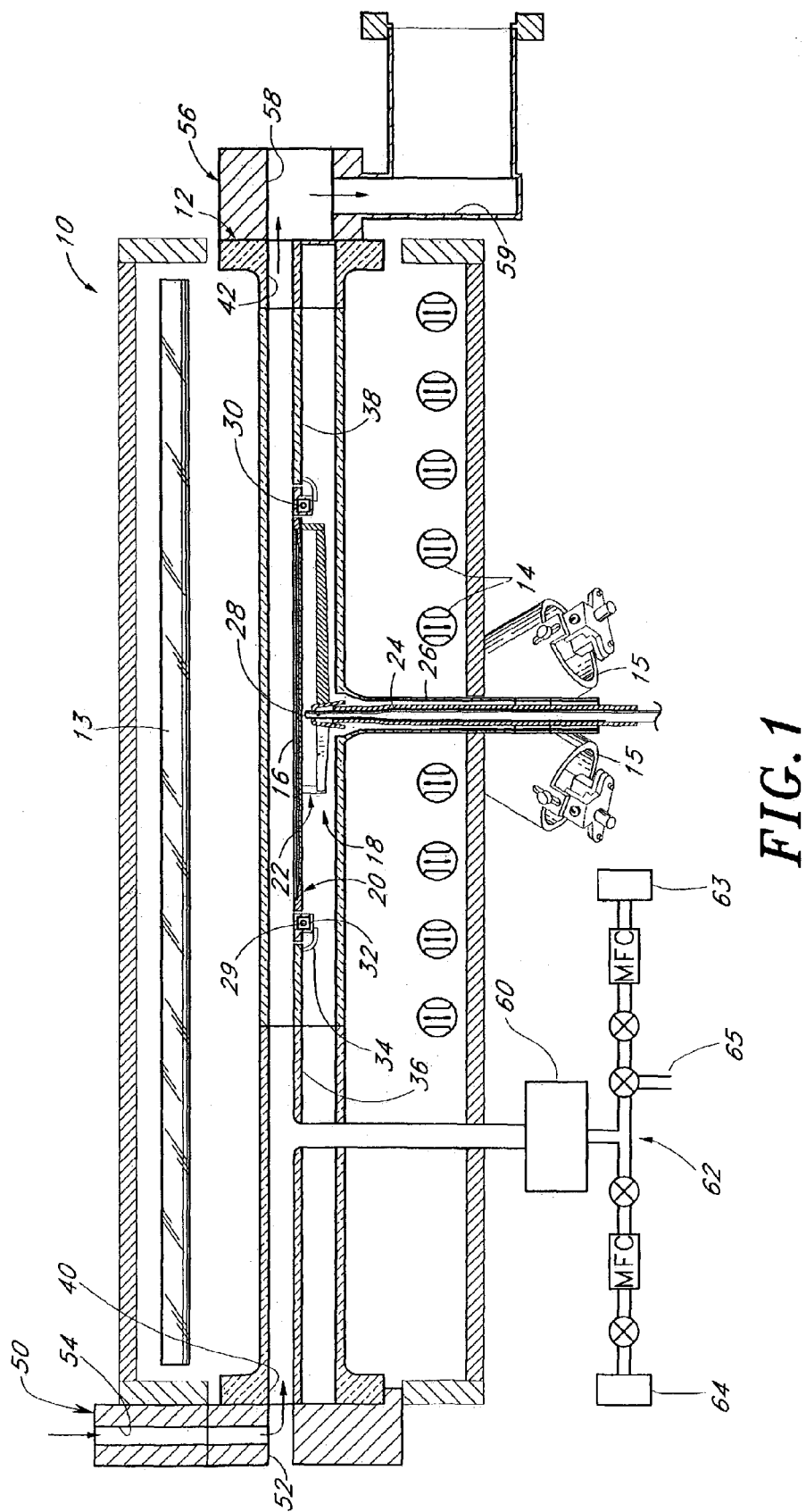
FIG. 1 is a schematic sectional view of an exemplary single-substrate reaction chamber for use with preferred embodiments of the invention.

FIG. 1 shows a chemical vapor deposition (CVD) reactor 10, including a quartz process or reaction chamber 12, constructed in accordance with a preferred embodiment, and for which the methods disclosed herein have particular utility. The superior processing control of the reactor 10 has utility in CVD of a number of different materials and can safely and cleanly accomplish multiple treatment steps sequentially in the same chamber 12. The basic configuration of the reactor 10 is available commercially under the trade name Epsilon™ from ASM America, Inc. of Phoenix, Ariz.

A plurality of radiant heat sources are supported outside the chamber 12 to provide heat energy in the chamber 12 without appreciable absorption by the quartz chamber 12 walls. The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors. The skilled artisan will appreciate, however, that the principles and advantages of the processes described herein can be achieved with other heating and temperature control systems.

A substrate, preferably comprising a silicon wafer 16, is shown supported within the reaction chamber 12 upon a substrate support structure 18. Note that, while the substrate of the illustrated embodiment is a single-crystal silicon wafer, it will be understood that the term "substrate" broadly refers to any surface on which a layer is to be deposited. Moreover, thin, uniform layers are often required on other substrates, including, without limitation, the deposition of optical thin films on glass or other substrates.

The illustrated support structure 18 includes a substrate holder 20, upon which the wafer 16 rests, and which is in turn supported by a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

A plurality of temperature sensors are positioned in proximity to the wafer 16. The temperature sensors can take any of a variety of forms, such as optical pyrometers or thermocouples. The number and positions of the temperature sensors are selected to promote temperature uniformity, as will be understood in light of the description below of the preferred temperature controller. In the illustrated reaction 10, the temperature sensors directly or indirectly sense the temperature of positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and a side thermocouple (not shown). Each of the peripheral thermocouples are housed within a slip ring 32, which surrounds the substrate holder 20 and the wafer 16. Each of the central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses, the slip ring 32 can reduce the risk of radial temperature non-uniformities across the wafer 16. The slip ring 32 can be suspended by any suitable means. For example, the illustrated slip ring 32 rests upon elbows 34 which depend from a front chamber divider 36 and a rear chamber divider 38. The dividers 36, 38 desirably are formed of quartz. In some arrangements, the rear divider 38 can be omitted.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and outlet 42.

An inlet component 50 is fitted to the reaction chamber 12, adapted to surround the inlet port 40, and includes a horizontally elongated slot 52 through which the wafer 16 can be inserted. A generally vertical inlet 54 receives gases from remote sources, as will be described more fully with respect to FIG. 2, and communicates such gases with the slot 52 and the inlet port 40. The inlet 54 can include gas injectors as described in U.S. Pat. No. 5,221,556, issued Hawkins et al., or as described with respect to FIGS. 21-26 in U.S. patent application Ser. No. 08/637,616, filed Apr. 25, 1996, the disclosures of which are hereby incorporated by reference. Such injectors are designed to maximize uniformity of gas flow for the single-wafer reactor.

Figure 2:
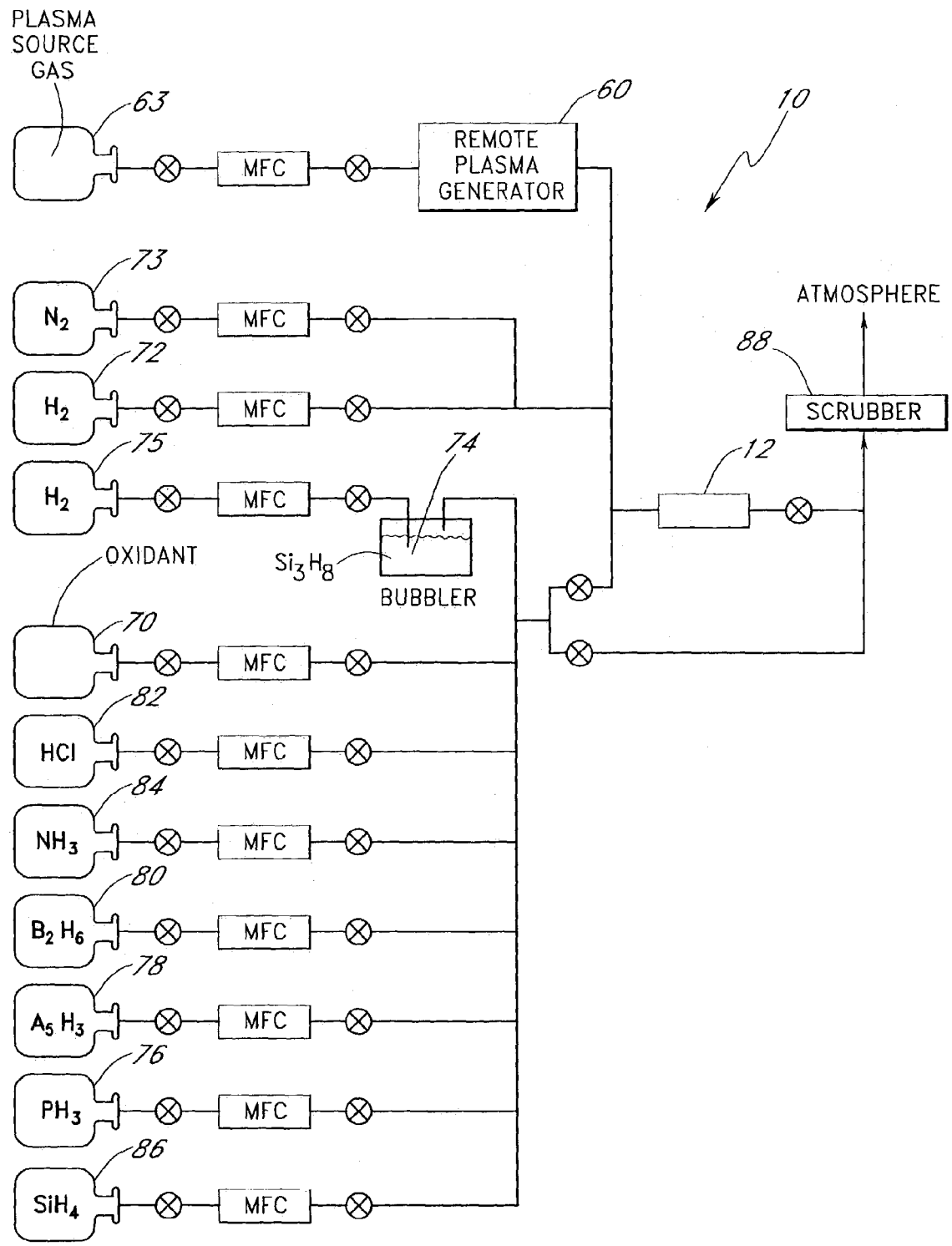
FIG. 2 is a gas flow schematic, illustrating exemplary reactant and inert gas sources in accordance with preferred embodiments of the invention.

An outlet component 56 similarly mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber 88 (FIG. 2). A pump or fan is preferably included to aid in drawing process gases through the chamber 12, and to evacuate the chamber for low pressure processing.

The preferred reactor 10 also includes a source 60 of excited species, preferably positioned upstream from the chamber 10. The excited species source 60 of the illustrated embodiment comprises a remote plasma generator, including a magnetron power generator and an applicator along a gas line 62. An exemplary remote plasma generator is available commercially under the trade name TRW-850 from Rapid Reactive Radicals Technology (R3T) GmbH of Munich, Germany. In the illustrated embodiment, microwave energy from a magnetron is coupled to a flowing gas in an applicator along a gas line 62. A source of precursor gases 63 is coupled to the gas line 62 for introduction into the excited species generator 60. The illustrated embodiment employs nitrogen gas as a precursor gas. A separate source of carrier gas 64 can also be coupled to the gas line 62, though in embodiments employing $N_2$ as the nitrogen source, separate carrier gas can be omitted. One or more further branch lines 65 can also be provided for additional reactants. Each gas line can be provided with a separate mass flow controller (MFC) and valves, as shown, to allow selection of relative amounts of carrier and reactant species introduced to the generator 60 and thence into the reaction chamber 12.

Wafers are preferably passed from a handling chamber (not shown), which is isolated from the surrounding environment, through the slot 52 by a pick-up device. The handling chamber and the process chamber 12 are preferably separated by a gate valve (not shown), such as a slit valve with a vertical actuator, or a valve of the type disclosed in U.S. Pat. No. 4,828,224.

The total volume capacity of a single-wafer process chamber 12 designed for processing 200 mm wafers, for example, is preferably less than about 30 liters, more preferably less than about 20 liters, and most preferably less than about 10. The illustrated chamber 12 has a capacity of about 7.5 liters. Because the illustrated chamber 12 is divided by the dividers 32, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer process chamber 12 of the illustrated type, but for 300 mm wafers, preferably has a capacity of less than about 100 liters, more preferably less than about 60 liters, and most preferably less than about 30 liters. One 300 mm wafer process chamber has a total volume of about 24 liters, with an effective processing gas capacity of about 11.83 liters. The relatively small volumes of such chambers desirably allow rapid evacuation or purging of the chamber between phases of the cyclical process described below.

FIG. 2 shows a gas line schematic, in accordance with the preferred embodiment. The reactor 10 is provided with a liquid reactant source 74 of trisilane as the preferred silicon source gas or precursor. An inert gas source 75 comprising a gas, preferably $H_2$, for bubbling liquid phase reactants 74 and carrying vapor phase reactants from the bubbler to the reaction chamber 12 is also shown. The bubbler holds liquid trisilane 74 as a silicon source, while a gas line serves to bubble the inert gas through the liquid silicon source and transport the precursors to the reaction chamber 12 in gaseous form.

As also shown in FIG. 2, the reactor 10 further includes a source 72 of hydrogen gas ($H_2$). As is known in the art, hydrogen is a useful carrier gas and purge gas because it can be provided in very high purity, due to its low boiling point, and is compatible with silicon deposition.

The preferred reactor 10 also includes a source 73 of nitrogen gas ($N_2$). As is known in the art, $N_2$ is often employed in place of $H_2$ as a carrier or purge gas in semiconductor fabrication. Nitrogen gas is relatively inert and compatible with many integrated materials and process flows. Other possible carrier gases include noble gases, such as helium (He) or argon (Ar).

In addition, another source 63 of nitrogen, such as diatomic nitrogen ($N_2$), can be provided to a remote plasma generator 60 to provide active species for reaction with deposited silicon layers in the chamber 12. An ammonia ($NH_3$) source 84 can additionally or alternatively be provided to serve as a volatile nitrogen source for thermal nitridation. Moreover, as is known in the art, any other suitable nitrogen source can be employed and flowed directly, or through remote plasma generator 60, into the chamber 12. In other arrangements, the gas source 63 can comprise a source of other reactant radicals for forming silicon-containing compound layers (e.g., O, C, Ge, metal, etc.).

The reactor 10 can also be provided with a source 70 of oxidizing agent or oxidant. The oxidant source 70 can comprise any of a number of known oxidants, particularly a volatile oxidant such as $O_2$, NO, $H_2O$, $N_2O$, HCOOH, $HClO_3$.

Desirably, the reactor 10 will also include other source gases such as dopant sources (e.g., the illustrated phosphine 76, arsine 78 and diborane 80 sources) and etchants for cleaning the reactor walls and other internal components (e.g., HCl source 82 or $NF_3/Cl_2$ (not shown) provided through the excited species generator 60). A source of silane 86 can also be provided, for deposition of a silicon layer after a first silicon layer has been deposited using a polysilane, as discussed below.

Each of the gas sources can be connected to the inlet 54 (FIG. 1) via gas lines with attendant safety and control valves, as well as mass flow controllers ("MFCs"), which are coordinated at a gas panel. Process gases are communicated to the inlet 54 (FIG. 1) in accordance with directions programmed into a central controller and distributed into the process chamber 12 through injectors. After passing through the process chamber 12, unreacted process gases and gaseous reaction by-products are exhausted to a scrubber 88 to condense environmentally dangerous fumes before exhausting to the atmosphere.

As discussed above, in addition to conventional gas sources, the preferred reactor 10 includes the excited species source 60 positioned remotely or upstream of the reaction chamber 12. The illustrated source 60 couples microwave energy to gas flowing in an applicator, where the gas includes reactant precursors from the reactant source 63. A plasma is ignited within the applicator, and excited species are carried toward the chamber 12. Preferably, of the excited species generated by the source 60, overly reactive ionic species substantially recombine prior to entry into the chamber 12. On the other hand, N radicals can survive to enter the chamber 12 and react as appropriate.

Additionally, the plasma can be generated in situ, in the reaction chamber. Such an in situ plasma, however, may cause damage, uniformity and roughness problems with some deposited layers. Consequently, where a plasma is used, a remotely generated plasma is typically preferred.

Trisilane

Manufacturers of microelectronic devices have long used silane ($SiH_4$) in CVD processes to deposit silicon-containing compound films. Nevertheless, it has been found to have numerous shortcomings, as discussed below.

It will be appreciated that in the manufacturing context, well-controlled and reproducible deposition processes are highly desirable in order to maximize device yields and production rates. Moreover, it is generally desirable for the deposited films to be as uniform as possible in both thickness and elemental composition. Existing processes using silane, due to the limitations of silane, however, tend to produce films that are non-uniform to varying degrees.

It has been found that dynamic temperature variations, due to limitations in heating and temperature control systems, play a significant role in the non-uniformity of films deposited on substrate surfaces by CVD. The surface temperature of the substrate has been found to influence the deposition rate and the composition of the resulting film. Thus, temperature variations across the surface of the substrate can cause variations in deposition rates, which in turn can cause thickness variations in deposited films.

These temperature variations can be due to several factors. For example, temperatures can change as deposition progresses, since temperature controls are often dependent upon the exposed surface of the substrate. Also, temperature variations of SiC-coated graphite components (e.g., pre-heat ring and susceptor) in single wafer, horizontal gas flow reactors can contribute to temperature and film non-uniformities. Moreover, imperfect control over other process parameters, including gas flow rates and total pressure, are also believed to contribute to non-uniformities in film physical properties.

Because of variations in these process variables, the rate of deposition at any particular instant varies as a function of position on the substrate, resulting in thickness variations in the film deposited across the surface of the substrate. Similarly, the composition of the film being deposited at any particular instant in time varies from place to place across the surface of the substrate for multi-component films. Without being limited by theory, such variation can be a direct consequence of the difference in dissociative absorption activation energy that exists between the precursors used to introduce each of the elemental components of the multi-component film, i.e., different precursors used in forming a compound can deposit at differing rates and have deposition rates with differing sensitivities to temperature variations. As a result, the averaging-out/tuning approaches discussed below do not necessarily solve the problem of compositional non-uniformity.

Problems with thickness and compositional non-uniformity can cause several practical problems. Significant variations in the thickness and/or composition of the silicon-containing compound films during the manufacturing process can lead to lower manufacturing yields when the affected devices do not meet the required performance specifications or standards. Also, variations across the film within a particular device can reduce device performance and/or reliability. In many cases, these problems are exacerbated because manufacturing involves depositing silicon-containing compound films during the process of making thousands or even millions of devices simultaneously on a wafer that is 200 millimeters (mm) in diameter. The industry is currently transitioning to 300 mm wafers, and can use even larger wafers in the future.

One technique to mitigate thickness non-uniformity is to deposit relatively thick films after the reaction conditions have been empirically tuned. This approach relies on the fact that thickness non-uniformities tend to average out over the deposition time of any particular layer. Reactor process variables such as temperature and placement of heating lamps, gas flow rate, gas pressure, gas composition, etc. can be tuned to average out the total film thickness, particularly in single-wafer systems with rotating wafer supports.

Tuning involves depositing a large number of films, each under a different pre-selected set of deposition conditions. The thickness variations within each film are then measured and the results analyzed to identify conditions that reduce or eliminate the thickness variations. Undesirably, a heavy expense is incurred due to the time and test wafers necessary to carry out this iterative process.

Tuning, moreover, does not necessarily produce uniform temperatures across the substrate throughout the deposition process. Rather, the result of the tuning process is to time-average the thickness variations produced by the temperature variations for a specific reaction temperature "set point," that is, the substrate temperature at which the reaction chamber apparatus is set. At a particular set-point, however, the temperatures across the surface of a substrate can still fluctuate.

This, in turn, raises the issue of compositional variation because compositional homogeneity is desired in three dimensions, both across the film surface and through the film thickness. For example, many films contain dopants and the level of these dopants influences the electronic properties of the film. Non-uniform temperatures can result in non-uniform incorporation of dopants or other reactants into the film.

The problem of deposition non-uniformity is particularly acute when. depositing very thin silicon-containing compound films. The ability to produce thin films is becoming more important as circuit dimensions shrink and the resulting devices become more compact. However, the averaging-out/tuning approaches described above are becoming increasingly inadequate because the deposition process time for a thin film is generally shorter than for a thick film, allowing less time for film thickness to average-out. In addition, highly compact devices are more sensitive to compositional non-uniformities, a problem that is not adequately addressed by averaging-out/reactor tuning.

In addition to the complications introduced by variable process conditions, film uniformity in thin films is also affected by nucleation phenomena. Nucleation is not completely understood, but deposition by CVD with silane has been observed to occur by a process in which a number of separate silicon islands initially form on the surface of the substrate. As the deposition proceeds, these islands tend to grow until they contact one another, eventually forming a continuous silicon film. At this point the silicon film typically has a rough surface with peaks that correspond to the initial nucleation sites and valleys that correspond to the areas between nucleation sites. As deposition proceeds further and the film thickens, thickness uniformity increases by an averaging-out process similar to that described above.

Thin, continuous silicon-containing compound films, however, are generally very difficult to prepare by existing silane deposition processes because the film can reach the desired thickness in the regions near the peaks of the islands before the islands have grown together to form a continuous film. These problems are exacerbated for thinner films and by the surface mobility of atoms in amorphous films. Continuity problems are typically observed when using silane to deposit films having a thickness of about 200 Å or less, and even more so for films having a thickness of less than about 100 Å. These problems are also exacerbated as the surface area of the film increases. Serious difficulties are often encountered for very thin films having a surface area of about one square micron or greater, and even more so for very thin films having a surface area of about 5 square microns or greater. The nature of the substrate can also complicate silane deposition to the extent that the surface influences nucleation and growth. Thus, for example, the deposition of very thin continuous amorphous silicon-containing compound films over patterned dielectric substrates using silane is particularly challenging.

In light of the foregoing, it has been discovered that trisilane ($H_3SiH_2SiH_3$ or $Si_3H_8$) offers substantial benefits when used as a silicon source, as disclosed in U.S. application Ser. No. 10/074,564, filed Feb. 11, 2002, and published PCT Application WO 02/064,853, published Aug. 2, 2002, the disclosures of which are hereby incorporated by reference in their entirety. Film deposition methods utilizing trisilane have now been discovered that are much less sensitive to temperature variations across the surface of the substrate. Moreover, deposition rates with trisilane increase substantially linearly with the rate of flow of trisilane into the deposition chamber and are relatively insensitive to substrate material and thickness. Also, trisilane has an extremely short film nucleation time, which reduces the size of localized crystalline deposits of silicon. As a result, deposited silicon films can be made thinner, while still being uniform. Moreover, the films will show reduced surface roughness due to the reduced size of the localized silicon deposits.

In addition, with regards to process throughput, trisilane exhibits higher deposition rates relative to silane. Trisilane also reduces thermal budgets, since it allows use of lower process temperatures than does silane.

Thus, employing trisilane in the deposition methods described herein provides numerous advantages. For example, these deposition methods enable the production of silicon-containing compound films that are uniformly thin and continuous. These advantages, in turn, enable devices to be produced in higher yields, and also enable the production of new devices having smaller circuit dimensions and/or higher reliability. These and other advantages are discussed below.

Process Flow

As described in greater detail below, in forming a silicon-containing compound layer, a thin silicon layer is desirably deposited on a substrate by first exposing the substrate to a silicon precursor, preferably, trisilane. The silicon layer can be reacted with another precursor to form a silicon-containing compound layer. In a preferred embodiment, the other precursor is a nitrogen source. The nitrogen source is introduced into the reaction chamber to nitride the silicon layer and form silicon nitride. Nitridation occurs when silicon in the silicon layer reacts with nitrogen from the nitrogen source to produce silicon nitride. The nitridation is preferably limited to the silicon layer on the surface of the substrate and advantageously results in a substantially perfect stoichiometry in the reaction of the silicon layer with the nitrogen source. Such a complete reaction allows less incorporated impurities, denser films, and improved thickness control and step coverage. In addition, as discussed below, the deposited layers have improved insulating properties, and can be made thicker than conventional insulating thin films, increasing the effectiveness of these deposited layers as diffusion barriers.

In other embodiments, the silicon layer can be reacted with reactants other than nitrogen to form other silicon-containing compound layers. For example, the silicon layer can be oxidized to form a silicon oxide layer. In such a case, an oxygen source can be used in place of a nitrogen source. The oxygen source can include, for example, atomic oxygen, water, ozone, oxygen, nitric oxide, nitrous oxide or other oxidants known in the art. Likewise, other precursors, known in the art, can be used to form silicon-containing compound layers including, but not limited to, silicon germanium, silicon carbide, metal silicides, etc.

In addition, multiple sequential cycles of these depositions and reactions can be performed to build up a silicon-containing compound layer to a desired thickness. Advantageously, different silicon-containing compound layers formed by the methods of the present invention can be formed one over another. For example, a silicon nitride film can be deposited over a silicon oxide film. In addition, the silicon-containing compound layer can be doped or otherwise further reacted. For example, a silicon nitride layer can be oxidized to form a silicon oxynitride layer.

Figure 3:
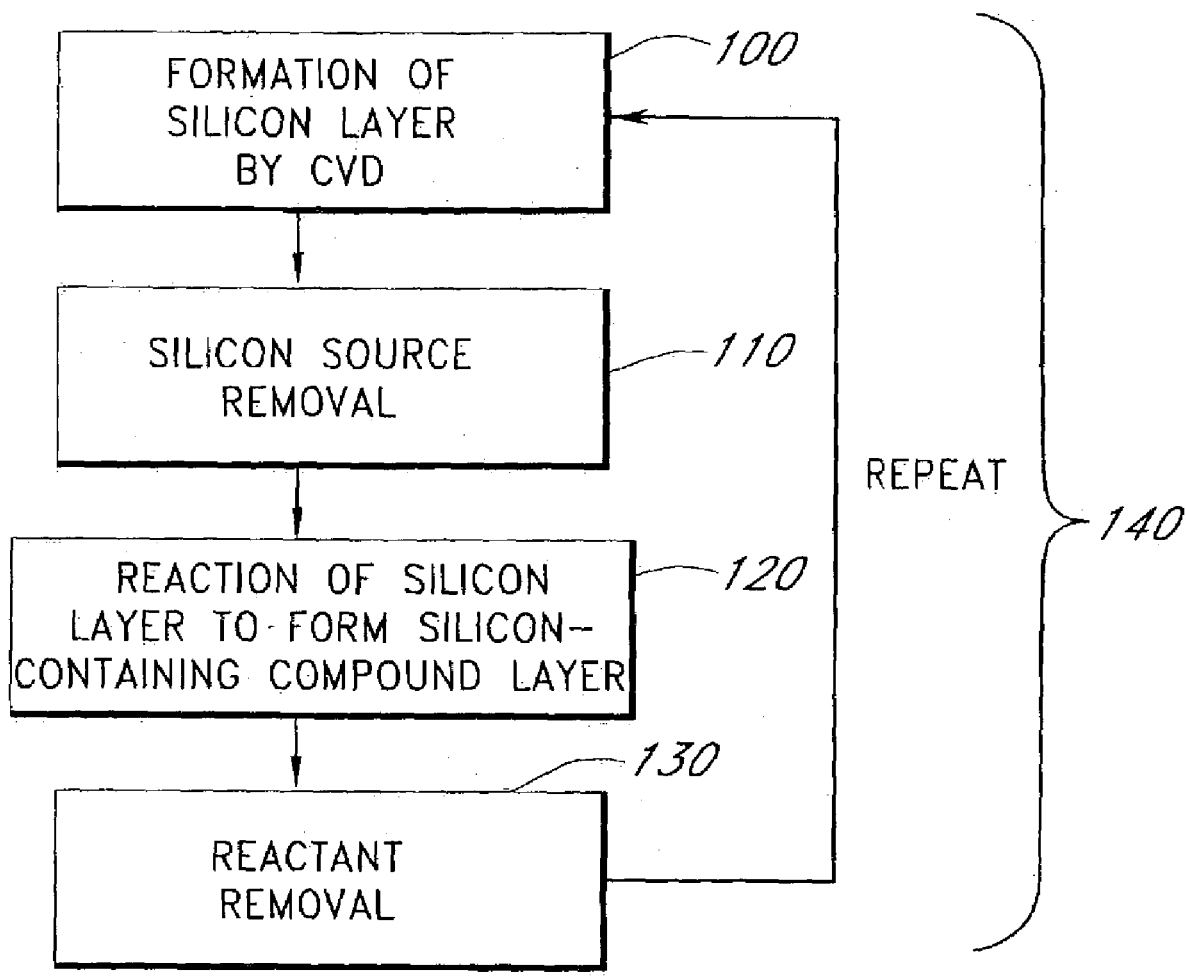
FIG. 3 is a flow chart generally showing steps for forming silicon-containing compound layers in accordance with preferred embodiments of the invention.

FIG. 3 shows a general process sequence in accordance with preferred embodiments of the invention. A substrate is provided in a process chamber and all sequence steps are preferably performed in situ in that process chamber.

Preferably, the process chamber is a single-wafer, horizontal gas flow reactor, preferably radiatively heated, such as the Epsilon™ series of single wafer reactors commercially available from ASM America, Inc. of Phoenix, Ariz. and described above with respect to FIGS. 1 and 2. Consequently, while the process illustrated in FIG. 3 can also be employed in alternative reactors, such as those having a showerhead arrangement, benefits in increased uniformity and deposition rates have been found to be particularly effective in the horizontal, single-pass laminar gas flow arrangement of the Epsilon™ chambers, employing a rotating substrate.

Referring to FIG. 3, in step 100, a silicon layer is formed on a substrate. "Substrate" is used herein in its usual sense to include any underlying surface onto which a silicon-containing material is deposited or applied in accordance with the preferred embodiments of the present invention.

Preferred substrates can be made of virtually any material, including without limitation metal, silicon, germanium, plastic, and/or glass, preferably silicon compounds (including Si—O—C—H low dielectric constant films) and silicon alloys. Substrates can also have on them physical structures such as trenches or steps. Particularly preferred substrates include silicon substrates or a silicon substrate with an interfacial layer over it. In addition, at processing temperatures of about 480° C. or greater, a hydrogen passivated Si<100> surface can advantageously be used as the silicon substrate.

A polysilane is preferably used as a silicon source to form the silicon layer 100. As used herein, a "polysilane" has the chemical formula $Si_nH_{2n+2}$, where n=2 to 4. Preferably, the polysilane is disilane or trisilane. Most preferably, the polysilane is trisilane. Consequently, while the invention is described in the context of particularly preferred embodiments employing CVD cycles with trisilane, the skilled artisan will appreciate, in view of the present disclosure, that certain advantages of the described processes can be obtained with other precursors and/or other deposition techniques.

In forming 100 the silicon layer, deposition of a silicon precursor, can be suitably conducted according to various deposition methods known to those skilled in the art, but the greatest benefits are obtained when deposition is conducted according to the CVD methods taught herein. The disclosed methods can be suitably practiced by employing CVD, including plasma-enhanced chemical vapor deposition (PECVD) or thermal CVD, utilizing gaseous trisilane to deposit a silicon-containing compound film onto a substrate contained within a CVD chamber. Thermal CVD is preferred for the silicon deposition phases of the process.

The polysilane is preferably introduced into the process chamber 12 (FIG. 1) in the form of a feed gas or as a component of a feed gas. The feed gas can include gases other than the polysilane, such as inert carrier gases. The carrier gas can comprise carrier gases known in the art, such as nitrogen, hydrogen, helium, argon, or various combinations thereof. Preferably, nitrogen is used as the carrier gas for the methods described herein.

Where the polysilane is trisilane, the trisilane is preferably introduced into the chamber by way of a bubbler used with a carrier gas to entrain trisilane vapor, more preferably a temperature controlled bubbler. Preferably, the trisilane flow rate from the bubbler varies from about 1 sccm to 1 slm, more preferably from about 50 sccm to 500 sccm. Preferably, the carrier gas has a flow rate varying from about 2 slm to 20 slm.

The total pressure in the reaction chamber 12 (FIG. 1) is preferably in the range of about 0.001 Torr to about 780 Torr, more preferably in the range of about 0.001 Torr to about 100 Torr, most preferably in the range of about 0.001 Torr to about 10 Torr. The partial pressure of trisilane is preferably in the range of about 0.0001% to about 100% of the total pressure, more preferably about 0.001% to about 50% of the total pressure. The relative partial pressures of the polysilane and other components of the feed gas are preferably held relatively constant over the course of depositing the silicon-containing compound film. It will be appreciated, however, that silicon layer formation 100 and other steps need not necessarily be performed isobarically, e.g., Step 100 can be performed at a higher pressure than Step 120, or vice versa.

Advantageously, deposition in the pressure range of 0.001 Torr to 10 Torr has been found to result in excellent uniformity. In addition, low partial pressures are generally desirable to maintain a lower hydrogen content during the process. Due to the inherently lower H:Si ratio in silanes with higher numbers of silicon -atoms, however, the partial pressure for, e.g., trisilane can be higher than that for lower order silanes, such as disilane and silane.

Preferably, silicon layer formation 100, and the cycle 140 generally, is performed isothermally. For thermal CVD, preferred deposition temperatures are in the range of about 400° C. to about 800° C., preferably about 450° C. to about 750° C., more preferably about 450° C. to about 650° C. Preferably, these temperatures correspond to the temperature setting for the substrate.

Preferably, deposition conditions are created to supply sufficient energy to to pyrollize or decompose the silicon precursor at a hot substrate surface and deposit silicon at a rate that is controlled primarily by the rate at which it is delivered to the substrate surface. Thus, for precursors such as trisilane, deposition is also preferably conducted under chemical vapor deposition conditions that are in or near the mass transport limited regime. In the mass transport limited regime, deposition rates are essentially independent of temperature. This means that small temperature variations across the surface of the substrate have little or no effect on deposition rate. It has been found that deposition in the mass transport limited regime greatly minimizes thickness and compositional variations and enables the production of the preferred silicon-containing compound films described herein. Thus, advantageously, such conditions allow for deposition with minimal loading effects or pattern sensitivity.

In forming the preferred silicon-containing compound layers, the thickness of the film formed in Step 100 can be varied according to the intended application, as known in the art, by varying the deposition time and/or gas flow rates for a given set of deposition parameters (e.g., total pressure and temperature). For a particular set of deposition conditions, the duration of silicon deposition for silicon layer formation 100 should be chosen so that a thin silicon layer is formed. By forming thin and uniform silicon layers, the layers can be easily fully reacted, e.g., nitrided or oxidized, allowing for the formation of the thin and uniform silicon-containing compound layers described below. Consequently, at less than about 650° C., the thickness of the silicon layer is preferably between about 3 Å and 25 Å, more preferably between about 3 Å and 15 Å, and most preferably between about 3 Å and 8 Å. It will be appreciated, however, that the preferred thickness range can vary depending upon process conditions such as temperature. At higher temperatures, thicker silicon layers can still be deposited while still allowing the layer to be fully reacted. For example, at temperatures of about 900° C. or higher, silicon layers of about 20-50 Å can be used.

After silicon layer formation 100, any excess silicon source and byproduct can be removed 110 from the process chamber. Silicon source removal 110 can occur by any one, or any combination of removal processes, including the following: purging of the process chamber with inert gas, evacuation of the silicon source, or displacement of the silicon source gas by a gas carrying a reactive species. Where silicon source source gas removal 110 is accomplished by displacement of the source gas with a gas carrying a reactive species, however, the process chamber is preferably a single substrate laminar flow chamber such as an ASM Epsilon™ series single wafer reactor, described above and illustrated in FIG. 1. In addition, where silicon source gas removal 110 is performed by purging, the process chamber 12 is preferably purged for several seconds.

It will be appreciated that silicon source gas removal 110 is preferably performed such that the quantity of a particular reactant in the chamber 12 (FIG. 1) is at a level sufficiently low as to minimize unwanted side reactions with the next reactant to enter the chamber 12. This in turn minimizes undesirable incorporation of impurities in the silicon-containing compound layers that are formed. Such a low level of reactants can be achieved by, for example, optimizing the duration of a purge or evacuation of chamber 12. At such a level, the process chamber can be said to be substantially free of a particular reactant.

After silicon source gas removal 110, the silicon layer can be reacted with a reactive species for formation of a silicon-containing compound layers 120. Such a reactive species can include, for example, a nitrogen source for forming silicon nitride layers, or an oxygen source for forming silicon oxide layers. Preferably, the silicon layer formed in Step 100 is exposed to the inflowing reactive species for a duration sufficient to completely stoichiometrically react with the reactive species. More preferably, the reaction conditions are chosen to completely react the silicon layer formed and to avoid damage to underlying structures, as discussed in more detail below with respect to the formation of silicon nitride layers.

After formation of the silicon-containing compound layers 120 reactant removal 130 can be performed using any of the methods described above for silicon source removal 110. It will be appreciated, however, that Steps 110 and 130 need not occur by exactly the same methods, e.g., one step can involve purging, while the other can involve evacuating.

Thus, performance of the steps 100, 110, 120, and 130 comprises one cycle 140 and deposits one layer of a silicon-containing compound on a substrate. The cycle 140 can then be repeated in sequence until the silicon-containing compound layers are built up to a desired thickness.

Consequently, the skilled artisan will appreciate that the present invention allows for the formation of layers of various thicknesses, a thickness being selected, for example, based upon the requirements of a particular application. For instance, for use as a gate dielectric, sufficient cycles are preferably conducted to grow a silicon nitride layer between about 3 Å and 20 Å in thickness. In another example, for use as a transistor sidewall spacer, the number of cycles performed can be selected to form a silicon nitride layer preferably between about 150 Å and 400 Å in thickness. It will be appreciated, however, that greater thicknesses are possible; for example, thicknesses up to 5000 Å can be formed after performing a sufficient number of cycles.

Figure 4A:
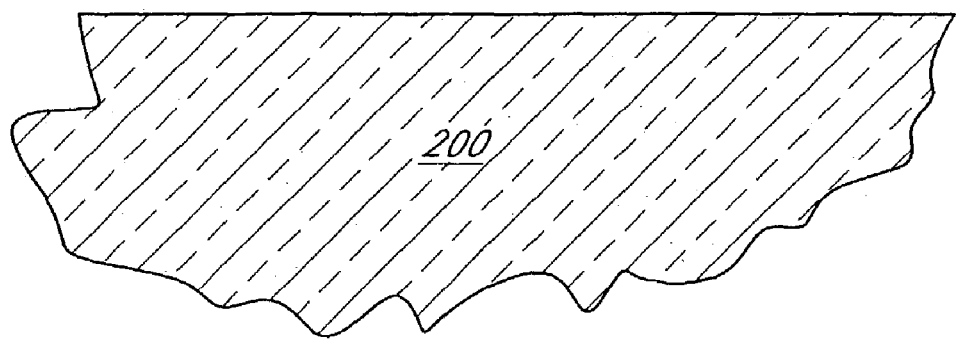
FIG. 4A illustrates a substrate before formation of a silicon-containing compound layer in accordance with preferred embodiments of the invention.
Figure 4B:
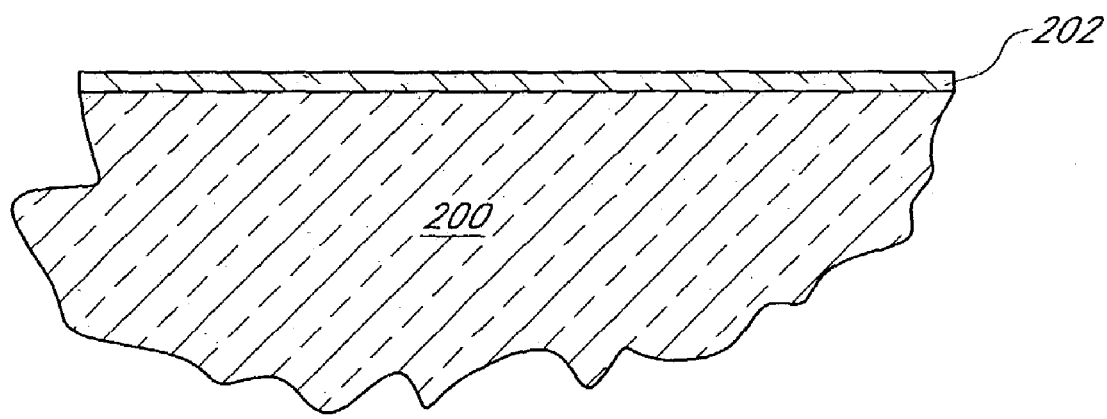
FIG. 4B illustrates the substrate of FIG. 4A after formation of a silicon layer in accordance with preferred embodiments of the invention.
Figure 4C:
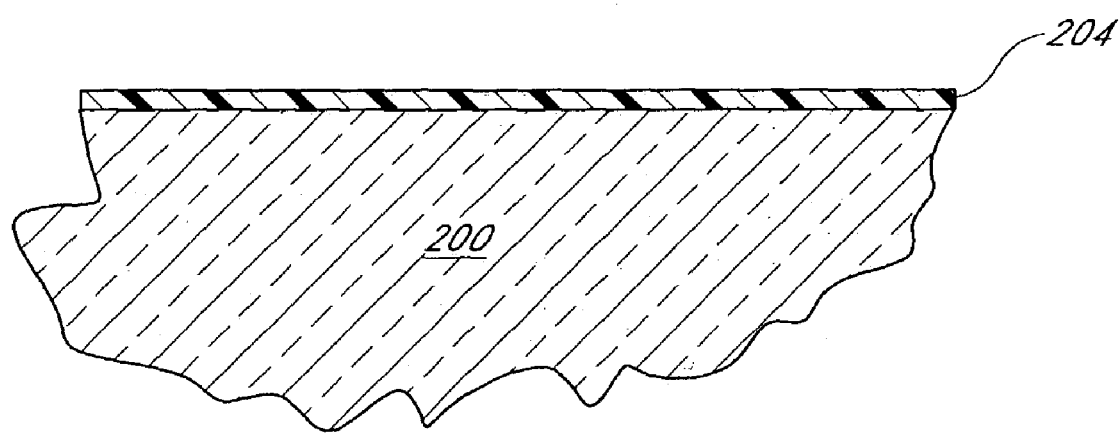
FIG. 4C illustrates a silicon-containing compound layer formed after reaction of the silicon layer of FIG. 4B with a reactive species in accordance with preferred embodiments of the invention.

Referring to FIGS. 4A through 4E, the result of the above-described process is shown in stylized illustrations. FIGS. 4A through 4C illustrate the formation of a silicon-containing compound layer after a single run of the cycle 140 illustrated in FIG. 3. FIG. 4A illustrates a substrate 200 prior to introduction of a silicon source into the chamber 12. FIG. 4B illustrates a first layer of silicon 202 deposited after introduction of the silicon source. FIG. 4C illustrates the silicon-containing compound layer 204 formed from the silicon layer 202 after reaction of the silicon layer 202 with a reactive species.

Figure 4D:
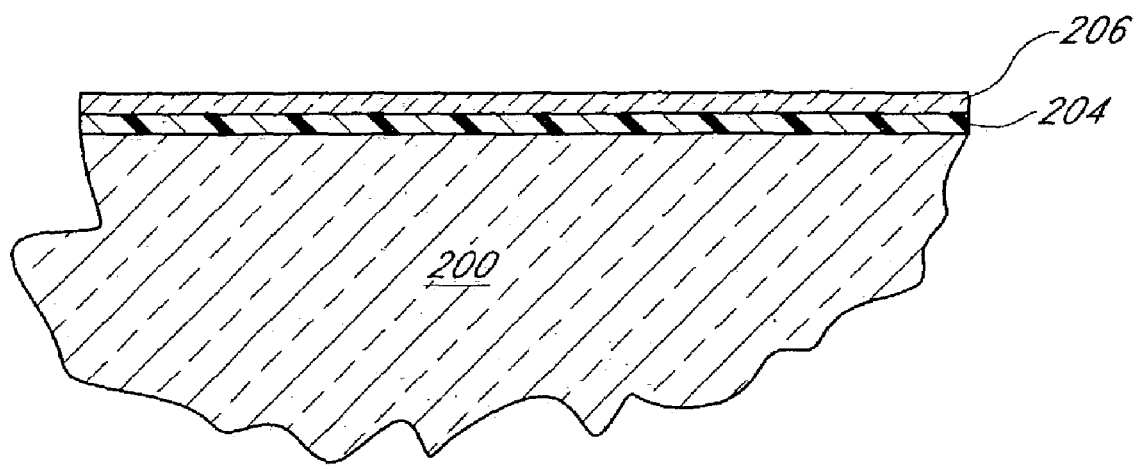
FIG. 4D illustrates a silicon layer formed on the silicon-containing compound layer of FIG. 4C in accordance with preferred embodiments of the invention.
Figure 4E:
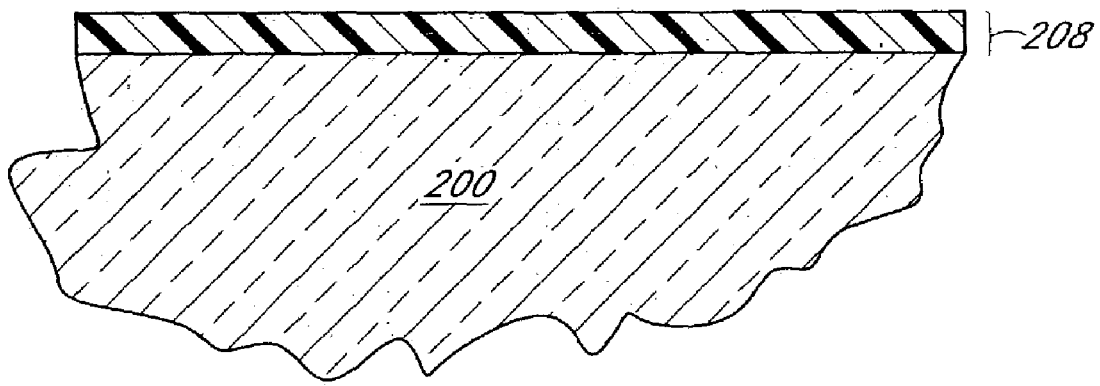
FIG. 4E illustrates a silicon-containing compound layer formed after reaction of the silicon layer of FIG. 4D with a reactive species in accordance with preferred embodiments of the invention.

After completing one cycle, other cycles can be performed. FIG. 4D illustrates a second silicon layer 206 deposited in a new cycle 140 on the silicon-containing compound layer 204 previously formed. Preferably, the same reactive species used in the previous cycle 140 is again introduced into the chamber 12 to react with the second silicon layer 206. As a result, a thicker silicon-containing compound layer 208 is formed having the combined thicknesses of the silicon-containing compound layer 204 and the second silicon layer 206. In this way, after repeated such cycles 140, the first silicon-containing compound layer 204 can be built up to a desired thickness.

Figure 5:
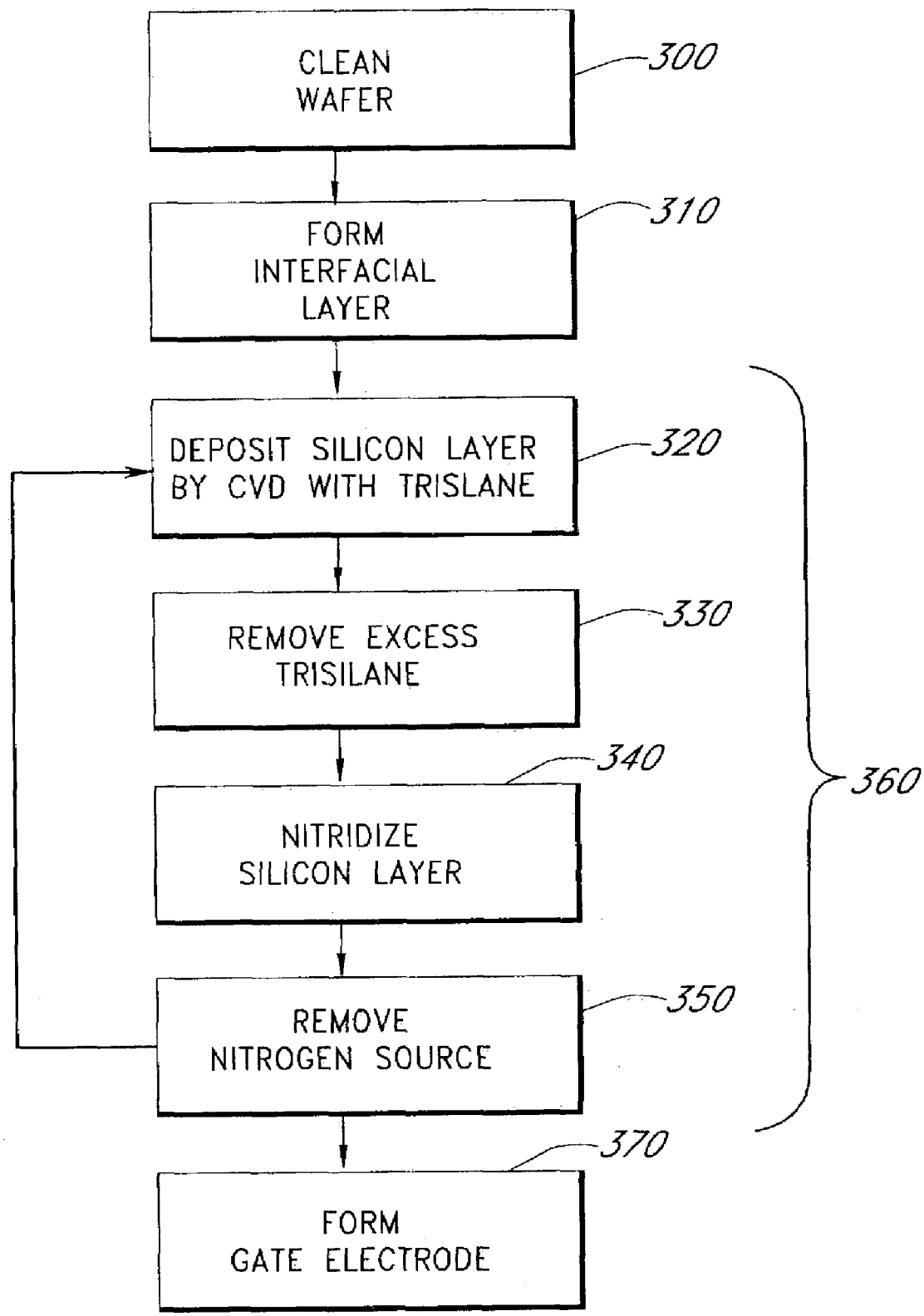
FIG. 5 is a flow chart showing steps for forming a silicon nitride dielectric layer in accordance with preferred embodiments of the invention.

As noted above, the present invention can be utilized to form silicon nitride layers in particular. FIG. 5 illustrates one possible process sequence for forming such a layer. In the illustrated embodiment, a gate dielectric layer comprising silicon nitride is formed over a semiconductor structure on a substrate.

In preparation for formation of the gate dielectric, the wafer is preferably first cleaned 300 to remove contaminants and naturally occurring or native oxide on the semiconductor structure. Conventionally, wafer cleaning is conducted ex situ, prior to loading the wafer into the process chamber 12 (FIG. 1). For example, wafers can be cleaned in an SC1/HF wet etch bath. Alternatively, an integrated HF and acetic acid vapor clean can be conducted in a neighboring module within a cluster tool, reducing transport time and opportunity for recontamination or reoxidation. In another arrangement, a hydrogen bake step can be conducted within the chamber 12 (FIG. 1) to sublimate native oxide. Small amounts of HCl vapor can be added to this step to aid in cleaning metal contaminants and the like during the hydrogen bake. In still another arrangement, plasma products can assist or be used to conduct in situ cleaning, such as by substituting H radicals for hydrogen gas. It will be appreciated that other methods of wafer cleaning, known in the art, are also suitable.

Either after ex situ cleaning, or prior to in situ cleaning, the wafer is loaded into the process chamber. Cleaning of native oxide tends to leave a hydrogen-terminated surface, which advantageously inhibits spontaneous reoxidation upon exposure to the clean room environment or other source of oxidants. Such hydrogen termination can be desorbed prior to further processes.

An interfacial layer, e.g., a silicon oxide layer, is then preferably formed 310 on the substrate to improve electrical performance of the deposited layers. The interfacial layer can be formed ex situ or in situ. The silicon oxide layer can be formed according to methods known in the art, including but not limited to thermal oxidation or other methods involving exposing the substrate to oxidant. For example, a crystalline silicon substrate surface, such as Si <100>, can be exposed to atomic oxygen or other known oxidizing chemicals (e.g. water, ozone, oxygen, nitric oxide, nitrous oxide, etc.) to form silicon oxide. In addition, the silicon oxide layer can also be formed by the cyclical process of FIG. 3, e.g., using trisilane to deposit a silicon layer and using an oxidant as the reactive species.

The silicon nitride layer can then be formed according the methods disclosed above.

In particular, a silicon layer is first formed 320 over the silicon oxide layer. Preferably, trisilane is flowed into the chamber 12 and deposited on the substrate by thermal CVD, under the conditions discussed above in the discussion of trisilane and FIG. 3.

While the preferred embodiments allow silicon layers of various thicknesses to be formed, preferably, the silicon layer thickness is chosen based upon nitridation conditions. This is because, as a silicon layer is nitrided, atomic nitrogen can diffuse through the silicon layer and into the underlying silicon substrate. The depth of this nitrogen diffusion can be measured, as known in the art, and is related to various process conditions, including nitridation temperature and duration of nitridation. Thus, for a given set of process conditions, atomic nitrogen will diffuse into, and possibly through, the silicon layer to a particular depth, called the nitridation saturation depth. When nitridation occurs for less than about one minute, the nitridation saturation depth can be termed the short-term nitridation saturation depth.

As discussed below in the discussion of the Deposited Silicon-containing compound layers, nitridation of the substrate has been found to result in silicon nitride layers with dielectric properties which are inferior to what is theoretically expected. Thus, to improve the dielectric properties of deposited silicon nitride films, nitridation of the underlying substrate is preferably minimized, preferably, by depositing the first silicon layer formed over a substrate to a thickness equal to or greater than the nitridation saturation depth. It will be appreciated that subsequently deposited layers will typically be spaced farther from the substrate than the nitridation saturation depth as a consequence of being deposited over this first silicon layer. As a consequence, the thickness of silicon layers deposited after the first preferably are less than or equal to the nitridation saturation depth.

For a given set of nitridation conditions, however, after forming the first silicon layer, subsequent silicon layers formed in subsequent cycles can be thinner since the nitridation saturation depth remains relatively constant while the silicon nitride layer thickness increases. For example, in preferred embodiments, the first silicon layer can be deposited to about the nitridation saturation depth, e.g., about 8 to 20 Å, and subsequent layers can be deposited to a thinner thickness, e.g., about 3 Å to 10 Å per cycle. In one preferred embodiment, the first silicon layer is deposited to a thickness of about 12 Å and subsequent layers are deposited to a thinner thickness of about 6 Å per cycle. In addition to varying the thickness of the silicon layer, it will be appreciated that other process conditions, such as the nitridation temperature and/or the duration of nitridation, can be varied so that the nitridation saturation depth is not deeper than the thickness of the silicon layer.

After Step 320, any excess trisilane is then preferably removed 330 from the chamber 12 by flowing a feed gas containing a nitrogen species into the chamber 12. Advantageously, the laminar flow chamber 12 (FIG. 1) allows flowing in a nitrogen source in a feed gas, the feed gas being used to both react with the deposited silicon layer and to force excess trisilane gas from the reaction chamber 12. As discussed above, however, the trisilane can also be removed by purging or evacuating the chamber 12.

A silicon nitride layer is then be formed 340 by introduction of a nitrogen source into the chamber 12 (FIG. 1). Preferred nitrogen precursors include chemical precursors such as $(H_3Si)_3N$ (trisilylamine), ammonia, atomic nitrogen, hydrazine $(H_2N_2)$, hydrazoic acid $(HN_3)$, $NF_3$, mixtures of the foregoing and dilutions of the foregoing with inert gases (e.g., $H_2$, $N_2$, Ar, He). Most preferably, atomic nitrogen is the nitrogen precursor.

The atomic nitrogen is preferably generated using the excited species generator 60 (FIG. 2). Nitrogen gas preferably is flowed through the excited species generator 60 at about 1 slm to 10 slm to generate the atomic nitrogen. More preferably, the nitrogen flow is combined with a carrier gas of helium, the carrier gas preferably having a flow between about 1 slm to 10 slm. Thus, using a remote plasma generator in conjunction with an ASM Epsilon™ series single wafer reactor, the excited nitrogen species is preferably pulsed into the chamber 12 (FIG. 1) alternately with trisilane.

Typically under the conditions discussed, the exposure to nitrogen source occurs for less than 2 minutes. It will be appreciated, however, that the duration of the pulse can vary with temperature, thickness of the silicon layer to be nitrided, sensitivity of underlying structures, and the reactor used. For instance, the pulse duration of less than about 2 minutes is related to the particular deposition properties of the ASM Epsilon™ series single wafer reactors; other reactors can require shorter or longer durations for nitriding a 3 Å to 25 Å silicon layer, depending on the particular properties of the reactor, as is known in the art.

After silicon nitride layer formation 340, a nitrogen source removal 350 is preferably performed to make the chamber 12 (FIG. 1) substantially free of the nitrogen source. For example, nitrogen source removal 350 can comprise purging or evacuating the chamber 12, flowing in a feed gas containing trisilane while stopping the nitrogen flow, or simply turning the excited species generator 60 power off while continuing to flow inert $N_2$.

After Step 350, a silicon layer formation 320 can then be performed to form a new silicon layer to begin a new cycle 360. The number of cycles 360 performed can be counted and optimized so as to deposit a layer of a desired thickness. Consequently, multiple cycles 360 can be performed until the desired thickness is reached, the total number of cycles 360 performed having been counted and correlated with a particular film thickness.

Accordingly, a preferred embodiment for a process to form silicon nitride layers for a gate dielectric layer comprises the following steps:

$Si_3H_8$ pulse
$Si_3H_8$ removal
Nitridation
Nitrogen source removal

After formation of the silicon nitride layer by cycles 360, a gate electrode can be formed 370, by methods known in the art.

Figure 6A:
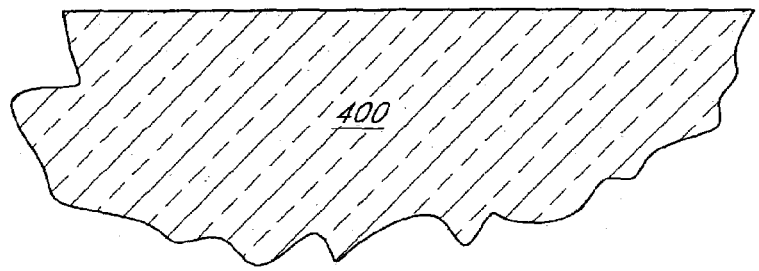
FIG. 6A illustrates a substrate after wafer cleaning, in accordance with preferred embodiments of the invention.
Figure 6B:
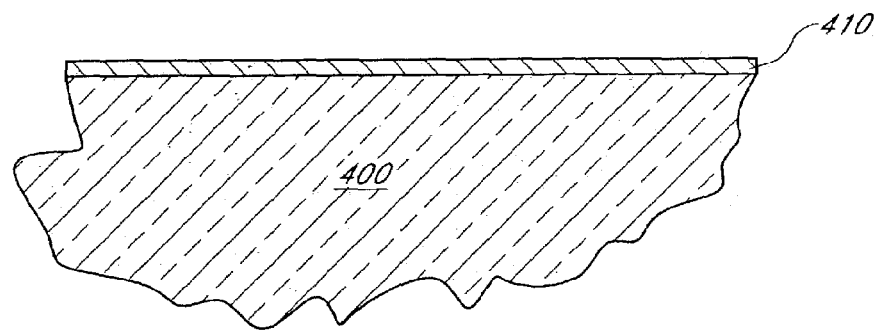
FIG. 6B illustrates the substrate of FIG. 6A after formation of a silicon oxide layer in accordance with preferred embodiments of the invention.
Figure 6C:
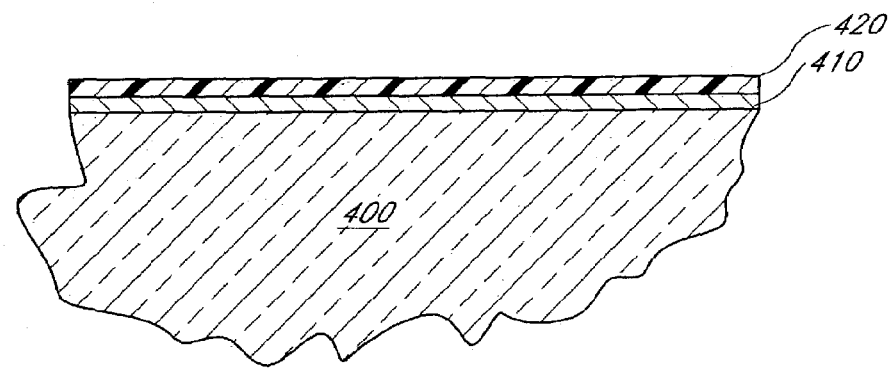
FIG. 6C illustrates a silicon-nitride layer formed over the silicon oxide layer of FIG. 6B in accordance with preferred embodiments of the invention.
Figure 6D:
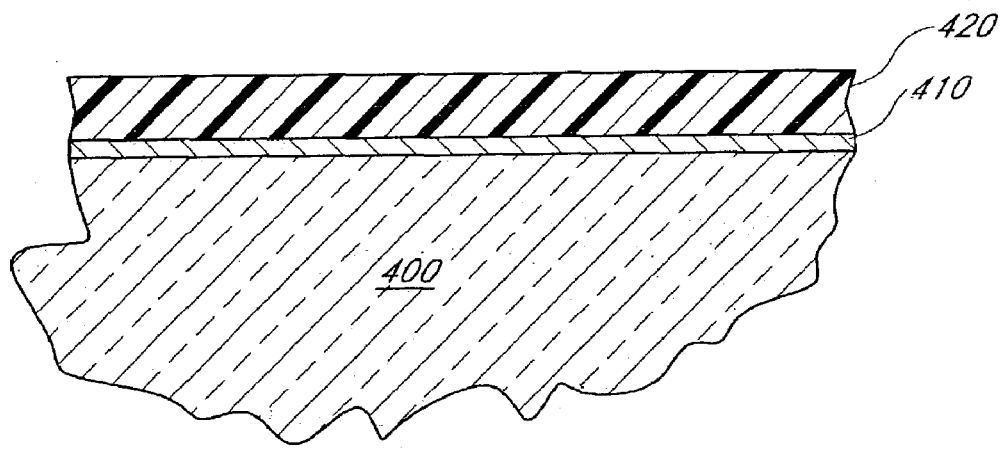
FIG. 6D illustrates the silicon nitride layer of FIG. 6C made thicker by formation of subsequent silicon nitride layers over the silicon nitride layer of FIG. 6C in accordance with preferred embodiments of the invention.
Figure 6E:
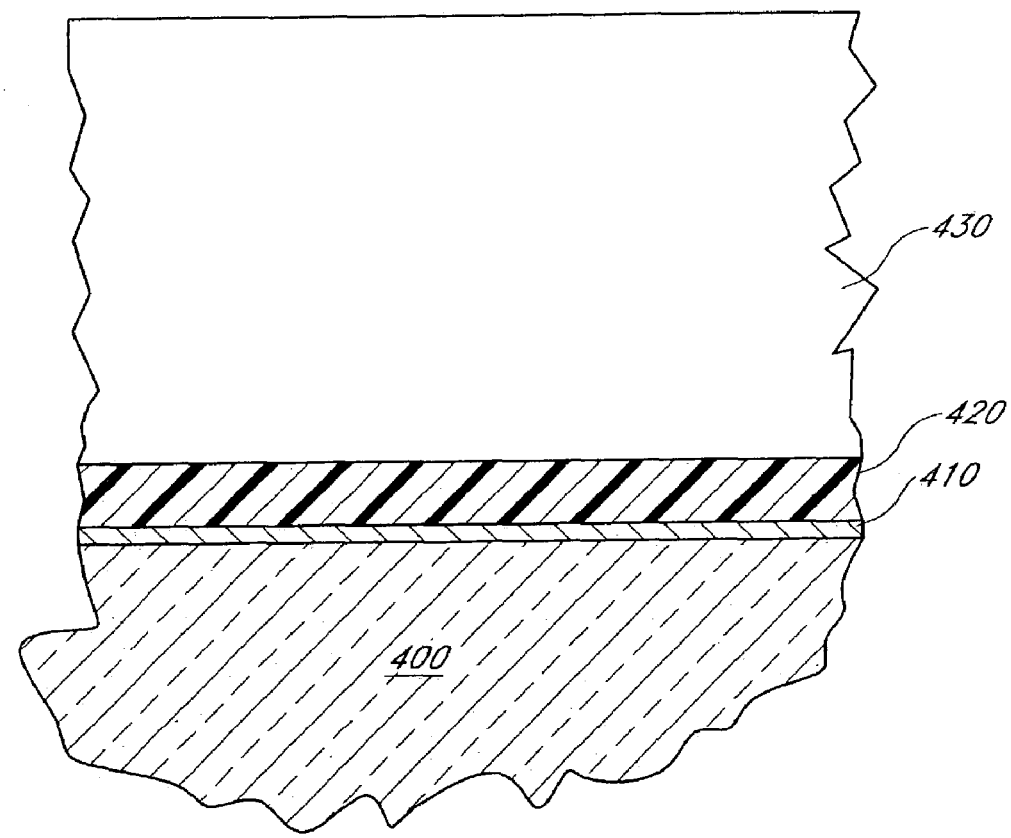
FIG. 6E illustrates a gate electrode formed after the silicon nitride layer of FIG. 6D has been formed to a preferred thickness in accordance with preferred embodiments of the invention.

Referring to FIGS. 6A through 6E, the result of the above-described process is shown in stylized illustrations. FIG. 6A illustrates a substrate 400 after wafer cleaning. FIG. 6B illustrates an interfacial layer 410 deposited over the substrate 400. FIG. 6C illustrates a silicon nitride layer 420 formed by performing a first cycle 360 (FIG. 5) over the interfacial layer 410. FIG. 6D illustrates the silicon nitride layer 420 made thicker by a subsequent performance of the cycle 360 (FIG. 5). FIG. 6E illustrates a subsequently formed gate electrode 430.

It will be appreciated that while the present invention is illustrated by specific reference to forming silicon nitride layers, the present teachings can also be applied to form other silicon-containing compound layers. For example, silicon oxides can also be formed directly on a substrate surface. In that case, rather than introducing a nitrogen source during formation of a silicon-containing compound layers 120 (FIG. 3), an oxygen source can be introduced. The oxygen source can include oxidants known in the art including, but not limited to, atomic oxygen, water, ozone, oxygen, nitric oxide, and nitrous oxide. Similarly, other precursors known in the art, can be used to form other silicon-containing compound layers including, but not limited to, silicon germanium and silicon carbide.

In other preferred embodiments, the silicon-containing compound layer can be subsequently reacted after steps 130 (FIG. 3) or 350 (FIG. 5) in each cycle. For example, the silicon-containing compound layers that serve as semiconductors (e.g., SiGe) can subsequently be doped. In another example, a silicon oxynitride ($SiO_xN_y$) layer can be formed from a silicon nitride layer. In this embodiment, after forming the silicon nitride layer, an oxygen source can be introduced to oxidize the silicon nitride and form the silicon oxynitride layer. It will be appreciated that such a silicon oxynitride layer can be used as an interfacial layer for forming dielectric layers in place of the silicon oxide layer described above with reference to FIG. 5. Silicon carbide nitride ($SiC_xN_y$) or silicon oxycarbide ($SiO_xC_y$) can similarly be formed by a subsequent nitridation or oxidation step.

It will also be appreciated that different silicon sources can be used in different cycles 140 (FIG. 3) or 360 (FIG. 5). In one preferred embodiment, trisilane can be used as the silicon source for one cycle, and disilane can be used for another cycle. Preferably, trisilane is used to form the first silicon layer deposited on a substrate in the first performance of cycles 140 (FIG. 3) or 360 (FIG. 5). Subsequent silicon layers can be formed using halosilanes (i.e., silicon compounds having the chemical formula $R_{4-X}SiH_X$, where R=Cl, Br or I and X=0 to 3) or other silanes ($Si_nH_{2n+2}$ where n=1 to 4, with n≧2 preferred). It will also be appreciated that combinations of silicon sources can be used, e.g., trisilane and disilane can be used simultaneously after forming the first silicon layer. In addition, note that some disilane will generally be present even when attempting to provide "pure" trisilane.

Figure 7:
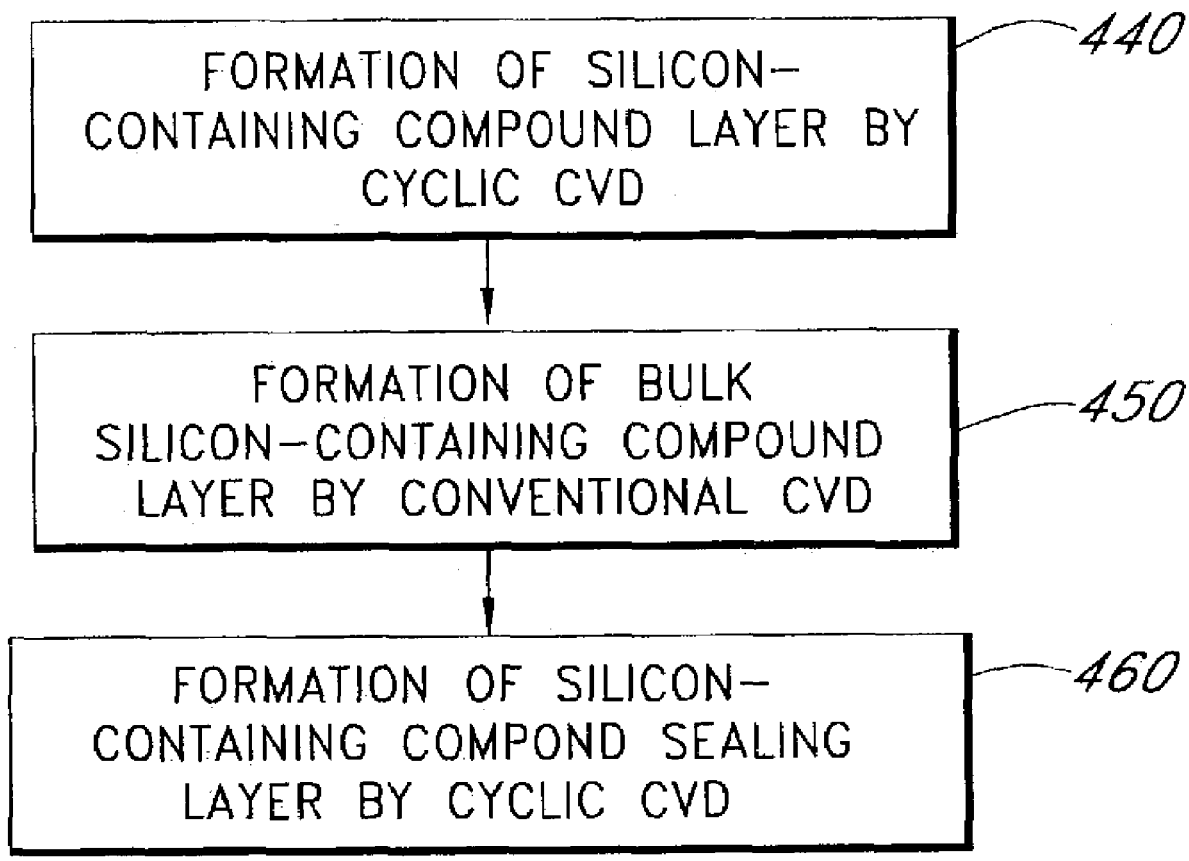
FIG. 7 is another flow chart generally showing steps for forming silicon-containing compound layers in accordance with preferred embodiments of the invention.

Advantageously, in addition to using different silicon sources in different cycles, different deposition processes can be used in conjunction with the CVD process of FIG. 3. Referring to FIG. 7, in one preferred embodiment, the CVD process of FIG. 3 is used to deposit 440 a silicon-containing compound layer to less than a desired thickness. For example, only one cycle of the process illustrated in FIG. 3 is performed. Subsequently, in order to increase throughput in cases, such as with spacer layers, where electrical performance, compositional purity, and high materials density are not paramount concerns, the majority of the remaining desired thickness of the silicon-containing compound layer can be deposited by a bulk deposition using non-cyclic methods, including conventional CVD 450 involving simultaneous introduction of precursors. In addition to trisilane, preferred silicon sources include halosilanes (i.e., silicon compounds having the chemical formula $R_{4-X}SiH_X$, where R=Cl, Br or I and X=0 to 3) or other silanes (e.g., $Si_nH_{2n+2}$ where n=1 to 4, with n≧2 preferred). Preferably, the silicon-containing compound layer is also sealed with a silicon-containing compound layer formed 460 according to the cyclical process of FIG. 3, so that the total thickness of the silicon-containing compound layers is a desired thickness.

In other preferred embodiments, after depositing 440 a thin silicon-containing compound layer, such as silicon nitride, the wafer containing the substrate can be removed from the reaction chamber into a second reaction chamber. In the second reaction chamber, a thicker PECVD or furnace silicon-containing compound layer, such as silicon nitride, can be deposited over the thin silicon-containing compound layer. Subsequently, the wafer is preferably removed to another reaction chamber for cyclic deposition 460 of another thin silicon-containing compound layer over the thicker silicon-containing compound layer. Preferably, this reaction chamber for cyclic deposition 460 is the same reaction chamber in which cyclic deposition 440 was performed.

In one preferred embodiment, a silicon nitride layer is deposited by performing one cycle of the process of FIG. 3, using trisilane as a silicon source. A thicker conventional silicon nitride is then formed by conventional CVD in the same reaction chamber, wherein silane and a nitrogen source are introduced simultaneously. A silicon nitride sealing layer is preferably then formed over the second silicon nitride layer by the process of FIG. 3, again using trisilane. In will be appreciated that where the third silicon nitride layer is formed, the thicknesses of all three silicon nitride layers are adjusted so that the aggregate thickness of the three layers is a desired total thickness.

Thus, the top and bottom of this silicon nitride layer is composed of highly conformal and uniform silicon nitride layers which also have low hydrogen content. Advantageously, this low hydrogen content corresponds to low boron diffusivity. Desirably, these superior top and bottom silicon nitride layers can function as diffusion barriers at the interface of the thicker silicon nitride layer of which they are a part of.

It will be further appreciated that the temperatures for Steps 100 (FIG. 3) or 320 (FIG. 5) need not necessarily be isothermal. In one preferred embodiment, a silicon layer formation 100 (FIG. 3) or 320 (FIG. 5) can occur at a first temperature that is less than about 525° C., preferably less than about 500° C., and most preferably less than about 475° C. Preferably, the layer is then allowed to stand for several seconds to allow for complete elimination of the hydrogen from the as-deposited silicon layer, prior to forming a silicon-containing compound layer 120 (FIG. 3) or 340 (FIG. 5). Preferably, the layer is allowed to stand for more than 10 seconds. For formation of the silicon-containing compound layer 120 (FIG. 3) or 340 (FIG. 5), the temperature is then increased to a second temperature that is higher than the first temperature. Preferably, subsequent cycles 140 (FIG. 3) or 360 (FIG. 5) are performed isothermally at this second higher temperature to deposited a silicon-containing compound layer of a desired thickness. Such a process is particularly useful for silicon nitride film deposition on non-crystalline silicon substrate surfaces (e.g., $SiO_2$, low dielectric constant spin on glass materials, metal oxides, metal silicates and metals), as the low temperature and hydrogen elimination period give a film with low hydrogen content at the interface with the substrate surface. Advantageously, the higher temperatures for subsequent deposition cycles allows for faster depositions and increased throughput after formation of the low hydrogen interface.

Deposited Silicon-Containing Compound Layerss

Desirably, preferred silicon-containing compound films according to the preferred embodiments have a thickness that is highly uniform across the surface of the film. Film thickness uniformity is preferably determined by making multiple-point thickness measurements, e.g., by ellipsometry or cross-sectioning, determining the mean thickness by averaging the various thickness measurements, and determining the rms variability. To enable comparisons over a given surface area, the results can be expressed as percent non-uniformity, calculated by dividing the rms thickness variability by the average thickness and multiplying by 100 to express the result as a percentage. Preferably, the thickness non-uniformity is about 20% or less, more preferably about 10% or less, even more preferably about 5% or less, most preferably about 2% or less.

Suitable methods for measuring film thickness include multiple-point ellipsometric methods. Instruments for measuring film thickness are well known and commercially available. Preferred instruments include the NanoSpec® series of instruments from Nanometrics, Inc., Sunnyvale, Calif. The thickness of a silicon-containing compound film can also be determined by cross-sectioning the substrate and measuring the thickness by an appropriate microscopy technique, most preferably by electron microscopy. The span over which a thickness is measured can be any span in the range of from about 10 times the thickness of the film to the entire span of the silicon-containing compound film. If the film thickness varies over the span, then the thickness is considered to be the average thickness, i.e., the numerical average of the thickest and thinnest dimensions of the film over a given span.

As used herein, rms (more properly, the square root of the mean squared error) is a way of expressing the amount of variability exhibited by the members of a given population. For example, in a group of objects having an average weight of y grams, each member of the group has a weight y' that differs from the average by some amount, expressed as (y'−y). To calculate rms, these differences are squared (to ensure that they are positive numbers), summed together, and averaged to yield a mean squared error. The square root of the mean squared error is the rms variability.

In addition to thickness uniformity, preferred silicon-containing compound films preferably provide a conformal coating over varied topography. A conformal coating is a layer that follows the curvature, if any, of the structure that it overlies. The conformal silicon-containing compound films preferably exhibit good step coverage. "Step coverage" refers to the thickness uniformity of a conformal film that overlies a stepped surface. A stepped surface is a surface that has two or more parallel components that are not disposed in the same horizontal plane. Step coverage is preferably determined by measuring the average thickness of the film at the bottom of the step, dividing it by the average thickness at the top of the step, and multiplying by 100 to express the result in percentage terms.

The preferred silicon-containing compound films have good step coverage even at relatively high aspect ratios. "Aspect ratio" refers to the ratio of the vertical height of the step to the horizontal width of the structure. At an aspect ratio in the range of about 4.5 to about 6, preferred silicon-containing compound films have a step coverage of about 70% or greater, more preferably 80% or greater. At an aspect ratio in the range of about 1 to about 4, preferred silicon-containing compound films have a step coverage of about 80% or greater, more preferably 90% or greater. Step coverage is preferably calculated as stated above, but can also be calculated by taking into account sidewall thicknesses. For example, alternate definitions of step coverage involve the ratio of the sidewall thickness to the average thickness at the top and/or bottom of the step. However, unless otherwise stated, step coverage herein is determined as stated above by measuring the average thickness of the horizontal portions of the silicon-containing compound film at the bottom of the step, dividing it by the average thickness of the horizontal portions at the top of the step, and multiplying by 100 to express the result in percentages.

Advantageously, surface smoothness and thickness of the preferred silicon-containing compound films are maintained over a surface area of about one square micron ($\mu m^2$) or greater, more preferably about 5 $\mu m^2$ or greater, even more preferably about 10 $\mu m^2$ or greater. The silicon-containing compound film can cover all or part of a large substrate, e.g., a wafer, and thus can have a surface area of about 300 $cm^2$ or greater, preferably about 700 $cm^2$ or greater.

Since good step coverage is usually achieved, in many cases the surface roughness of the silicon-containing compound film is substantially the same as the roughness of the surface that it overlies. Surface roughness is preferably rms surface roughness as measured by atomic force microscopy (AFM) on a 1 micron×1 micron portion of the surface in question. The roughness of the underlying substrate surface can range from about 1 Å rms (atomically flat surface) up to about 25 Å rms or even higher. Preferably, the underlying substrate surface has a roughness of 10 Å rms or less, more preferably 5 Å nms or less, so that the overlying silicon-containing compound film has a comparable roughness. For an underlying substrate surface having a given degree of roughness, the silicon-containing compound film deposited thereon preferably has a surface roughness that is greater than the substrate surface roughness by an amount of about 5 Å or less, more preferably about 3 Å or less, even more preferably about 2 Å or less. For example, if the substrate surface roughness is about 7 Å rms, then the measured surface roughness of the silicon-containing compound film deposited thereon is preferably about 12 Å rms (7 Å+5 Å) or less. Preferably, the underlying surface has a roughness of about 2 Å rms or less and the overlying silicon-containing compound film has a measured surface roughness of about 5 Å rms or less, more preferably about 3 Å rms or less, most preferably about 2 Å m s or less.

These advantages are evident in data obtained for a silicon nitride layer formed by the embodiment of the Example below, in which trisilane was used as the silicon source and atomic nitrogen was used as the nitrogen source.

Figure 8:
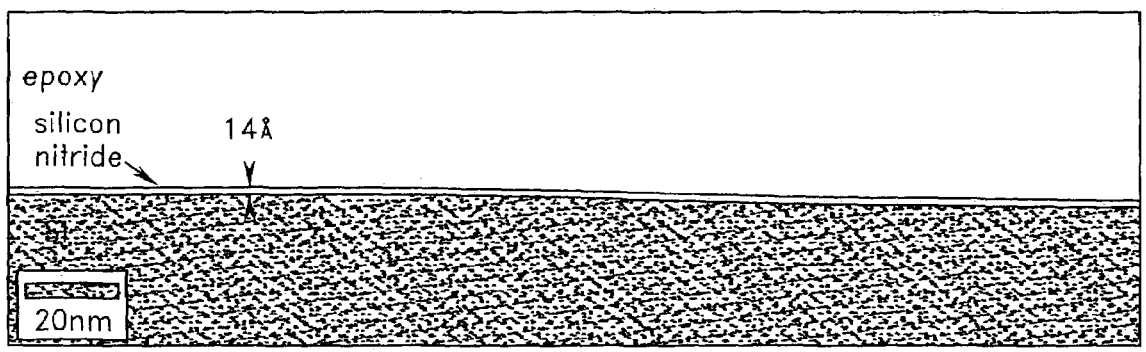
FIG. 8 is a reproduction of a transmission electron photomicrograph showing a cross section of a silicon nitride film formed in accordance with preferred embodiments of the invention.

FIG. 8 is a reproduction of an actual transmission electron photomicrograph showing a cross section of a silicon nitride film formed in accordance with the preferred embodiments. It is evident that even at the nanometer scale of the photomicrograph, the silicon nitride layer only 14 Å thick exhibited excellent uniformity.

Figure 9:
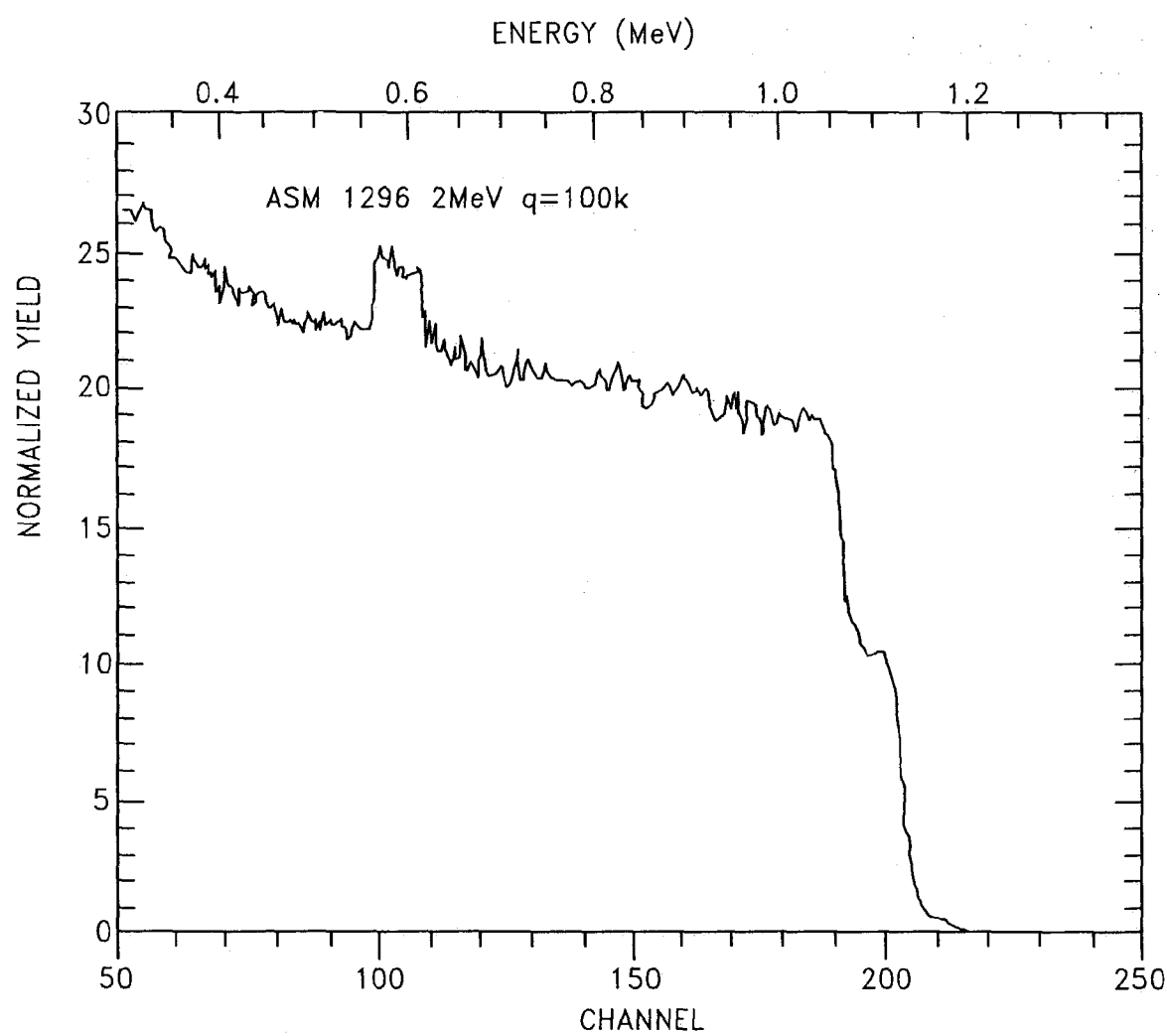
FIG. 9 shows a RBS spectrum for a silicon nitride film formed in accordance with a preferred embodiment of the invention.

The silicon nitride films also showed excellent stoichiometry and purity. In particular, as known in the art, values for the ratios of silicon and nitride in silicon nitride films can be determined by Rutherford Backscattering (RBS). FIG. 9 is a representative RBS spectrum (2 MeV $He^{++}$) of a silicon nitride sample formed in accordance with preferred embodiments of the invention. Analysis of RBS spectrum data using simulations based on the RUMP modeling program allowed quantification of the silicon and nitrogen concentrations. Significantly, the data indicates a substantially stoichiometric silicon nitride film, as the silicon nitride was found to have a stoichiometry of about $Si_{43}N_{56}$, or a ratio of about 1.30 nitrogen atoms per silicon atom, approximately equal to perfectly stoichiometric silicon nitride, $Si_3N_4$, which has a ratio of about 1.33 nitrogen atoms per silicon atom.

Figure 10:
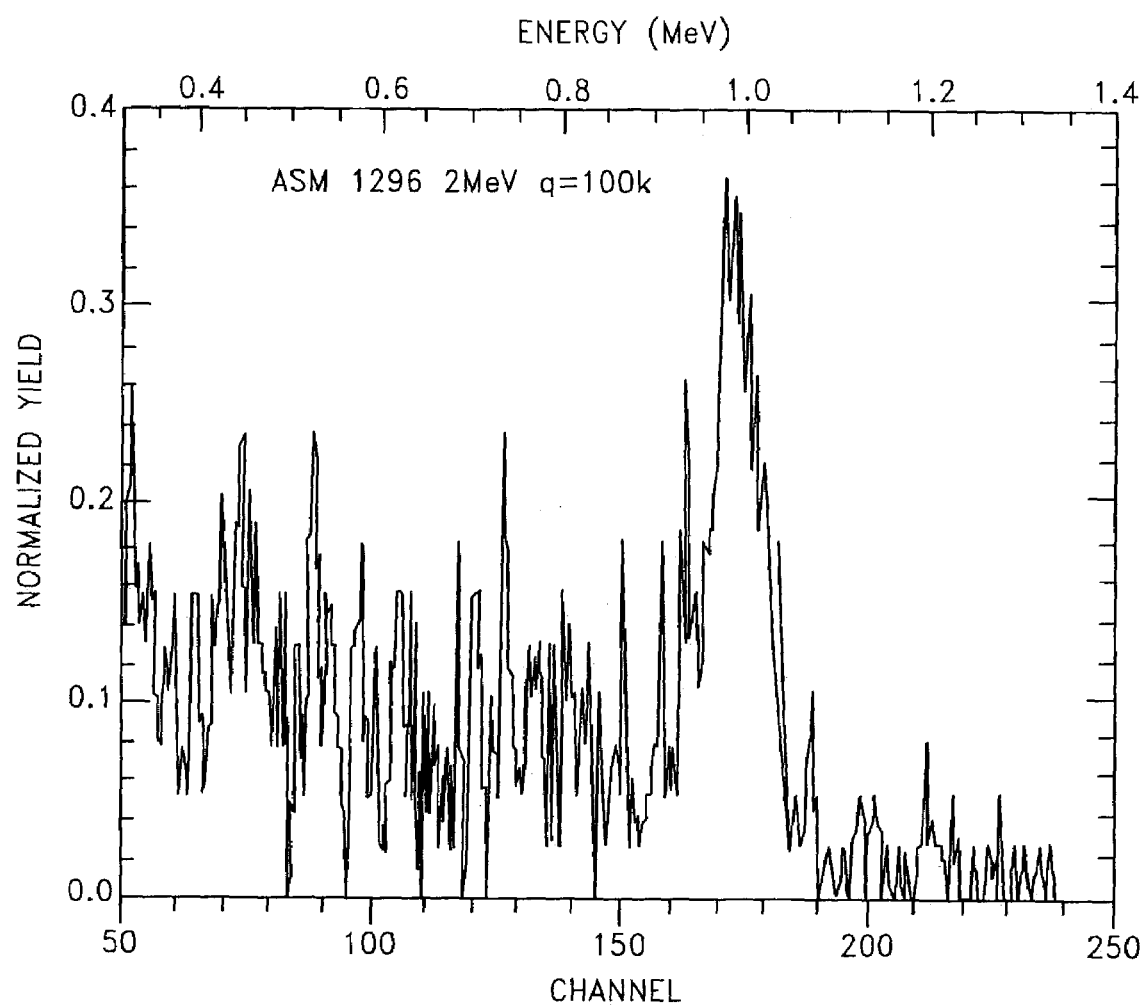
FIG. 10 shows a RBS ERD spectrum for a silicon nitride film formed in accordance with a preferred embodiment of the invention.

In addition, as also known in the art, an RBS Elastic Recoil Detection (ERD) spectrum can be used to analyze hydrogen content. Such a spectrum was obtained and is shown in FIG. 10. Again, the silicon nitride film showed excellent compositional purity, with quantitative analysis using the RUMP indicating that hydrogen concentration within the film was below the detection limits of the technique, i.e., incorporated hydrogen less than 0.2 atomic percent. Thus, analysis of the silicon nitride films showed the films to have excellent purity and stoichiometry.

Advantageously, the high conformality and physical and chemical uniformity of silicon-containing compound layers formed in accordance with the preferred embodiments have improved physical properties relative to similar layers formed by conventional processes. For example, it has been found that insulating layers of silicon compounds, e.g., silicon nitride and silicon oxide, have lower than theoretically expected insulating properties due in part to reaction of the underlying substrate when forming the silicon compound and also due to incorporated impurities, such as incorporated hydrogen. Desirably, the preferred insulating layers have low incorporated hydrogen and minimized reactions of the underlying substrate, resulting in improved insulating properties.

In particular, silicon nitride films formed according to the present invention can be used in applications where other compounds, such as silicon oxynitrides, have traditionally been favored. Desirably, due to its different materials properties in comparison to silicon oxynitrides, use of silicon nitride in such applications results in a layer with a higher dielectric constant and better barrier properties.

In addition, in forming silicon nitride layers, the process temperature is preferably reduced relative to a conventional CVD process utilizing silane. As such, nitrogen diffusion towards a silicon channel can be reduced in gate dielectric applications where the amount of nitrogen at the silicon-dielectric interface must be carefully controlled and limited.

Moreover, because of its high dielectric constant, silicon nitride layers can be superior in some applications, such as for gate dielectrics. This is because, as device critical dimensions continue to shrink, the utility of traditional materials such as $SiO_2$ for gate dielectric applications is decreasing due to limitations arising from the fundamental materials properties of silicon oxides. These limitations are particularly acute for physical thicknesses below about 15 Å, when quantum mechanical tunneling becomes a dominant mechanism for current leakages through the dielectric layer. In addition, ultra-thin $SiO_2$ layers are poor barriers to the diffusion of electrically active dopant atoms. Consequently, insulating thin film materials with a dielectric constant greater than that of $SiO_2$ have been determined to be desirable in order to improve leakage current performance and to act as better barriers to dopant atom diffusion. In addition to gate dielectric applications, silicon nitride films can also be employed as spacers in a number of transistor applications. For all of these applications, the thin silicon nitride films preferably have exceptional properties with regard to leakage current performance. In addition, for gate dielectric application, the thin silicon nitride films preferably exhibit superior electrical performance from a carrier mobility perspective, which implies that they have low interfacial trap density (i.e., an acceptable interface with the crystalline semiconductor surfaces onto which they will be deposited).

While conventional silicon nitride films, by virtue of the higher dielectric constant of silicon nitride itself, has theoretically appeared to fit this need, in practice, silicon nitride films formed by conventional CVD processes have not exhibited the physical and electrical properties required for gate dielectric applications. Typically, these films have exhibited leakage currents only marginally better than that of $SiO_2$ at comparable physical thicknesses. It is believed that this has been due in part to the chemical composition of the films, i.e., the presence of impurities incorporated into the silicon-nitride layers. Elements such as hydrogen, carbon and oxygen are believed to be the principal impurities responsible for film properties that do not meet theoretical predictions. It is also believed that the unintentional presence of nitrogen at the interface with a crystalline silicon surface, "below" the silicon nitride layer itself, contributes to the less than expected electrical performance. This nitrogen within the underlying bulk semiconductor is thought to be present as a by-product of the silicon nitride deposition process.

While silicon nitride layers formed by conventional CVD have been disappointing in the areas discussed above, preferred silicon nitride layers formed as discussed above have exceptional within-wafer and wafer-to-wafer thickness, elemental concentration uniformity and low contaminating element concentrations. Moreover, these preferred silicon nitride layers have fewer impurities than conventionally formed silicon nitride layers and exhibit electrical properties more consistent with theoretical predictions. Moreover, by depositing the first silicon layer over a substrate to a thickness equal to or greater than the nitridation saturation depth, the presence of nitrogen below the silicon nitride layer is minimized. As the first layer is already greater than or equal to a nitridation saturation depth, subsequent silicon layers can advantageously be deposited to a thickness less than a thickness equal to the nitridation saturation depth. Thus, in addition to being more uniform and conformal than silicon-containing compound layers formed by conventional CVD processes, silicon-containing compound films formed in accordance with the preferred embodiments can also exhibit superior dielectric or electrical properties.

Figure 11:
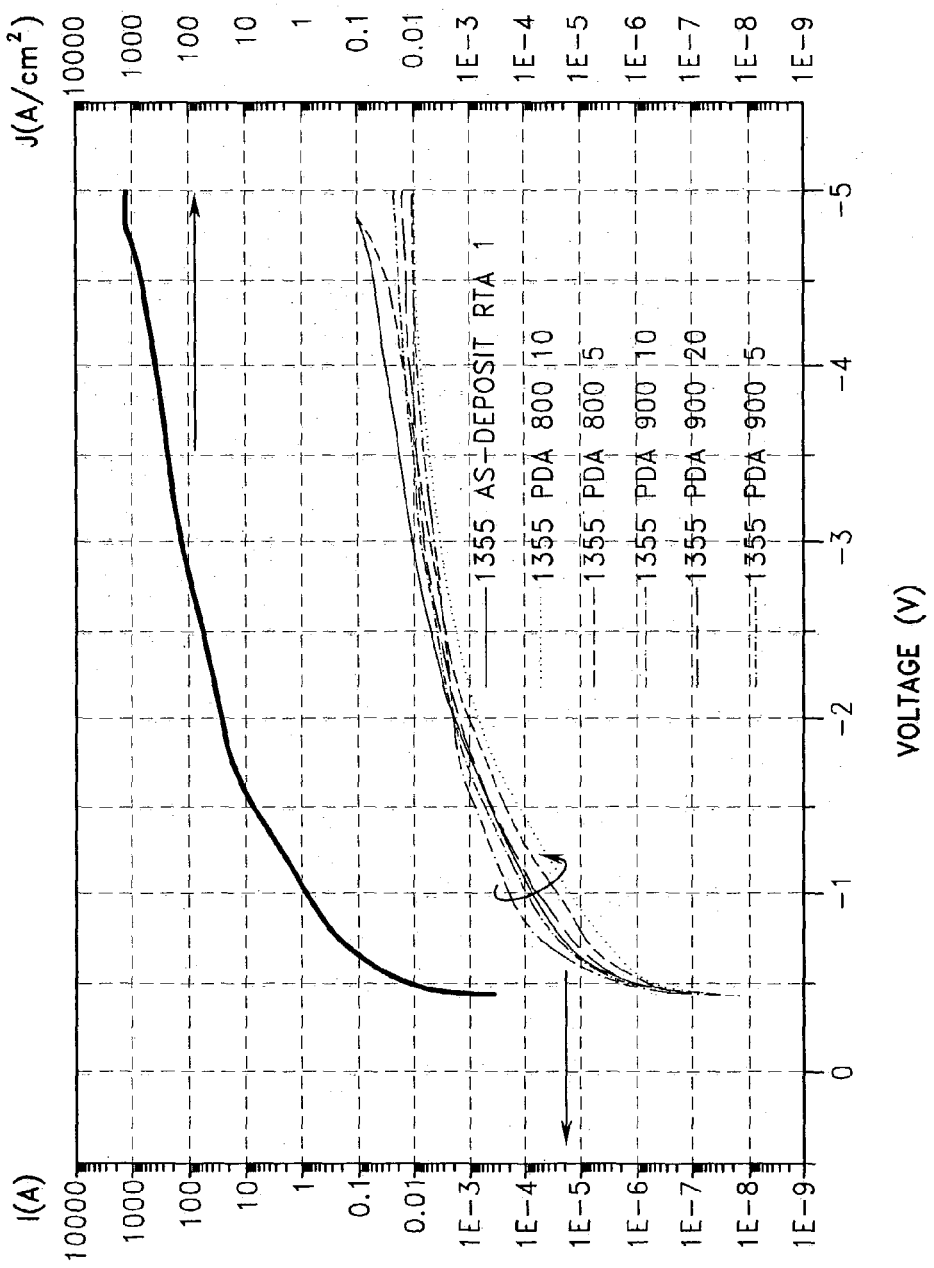
FIG. 11 shows leakage current data for a silicon nitride film formed in accordance with a preferred embodiment of the invention.

Leakage current data was obtained for the silicon nitride films formed in accordance with the Example, discussed below. As shown in FIG. 11, the silicon nitride films exhibited exceptionally low leakage current, even for films with physical thicknesses as low as about 14 Å.

Additionally, it will be appreciated that silicon nitride layers can be formed over a silicon oxide or silicon oxynitride layer, further improving the eletrical properties of the integrated silicon nitride film. The silicon oxide and silicon oxynitride layers can thus be used as an interfacial layer. These layers can be formed as discussed above, or by methods known in the art.

In addition, the silicon nitride layers formed according to the methods of the present invention also show improved oxidation resistance. The improved oxidation resistance makes the films less sensitive to clean room air exposure or to oxygen or moisture present in the reaction chamber (due to, e.g., leaks or gas purity problems) during subsequent, steps such as annealing after layer formation. Advantageously, such an anneal can be performed under oxidizing or with inert ambient conditions.

EXAMPLE

An exemplary method of forming the illustrated gate structure will now be described in detail:

A silicon nitride layer was formed in a single substrate Epsilon™ reactor from ASM America, Inc. of Phoenix, Ariz. A wafer was loaded into the reaction chamber and prepared for trisilane deposition. Trisilane was flowed into the reaction chamber for 6 seconds at 63 sccm. The reaction chamber was purged for 10 seconds with nitrogen gas. Atomic nitrogen was generated by flowing nitrogen gas into a microwave radical generator (MRG) at 6 slm and flowed into the reaction chamber for 145 seconds. The reaction chamber was then purged with nitrogen gas for 10 seconds. About 5 Å of silicon nitride was deposited per cycle and eight cycles were performed to form a silicon nitride layer of about 40 Å in thickness. Each step of each cycle was performed isothermally at 650° C. and isobarically at 3 Torr.

It will be appreciated by those skilled in the art that various omissions, additions and modifications can be made to the processes described above without departing from the scope of the invention, and all such modifications and changes are intended to fall within the scope of the invention, as defined by the appended claims.

We claim:

1. A method of forming a layer, of an insulating silicon compound, having a desired thickness for an integrated circuit, comprising:

performing multiple chemical vapor deposition cycles in a reaction chamber, each cycle comprising:

first, depositing a silicon layer on a substrate by exposing the substrate to a silicon source, wherein the silicon layer has a silicon layer thickness between about 3 Å and 25 Å, wherein depositing the silicon layer is performed under mass transport limited deposition conditions; and second, reacting the silicon layer to partially form the layer of an insulating silicon compound, wherein trisilane is the silicon source used to deposit a first silicon layer on the substrate in a first performance of a cycle of the plurality of cycles, wherein the silicon-containing compound layer has a thickness non-uniformity of about 5% or less and a step coverage of about 80% or greater.

2. The method of claim 1, wherein reacting comprises nitriding and wherein the insulating silicon compound is silicon nitride.

3. The method of claim 2, wherein the layer of an insulating silicon compound has a stoichiometry of about 43 silicon atoms per 56 nitrogen atoms.

4. The method of claim 1, wherein reacting comprises oxidizing and wherein the insulating silicon compound is silicon oxide.

5. The method of claim 1, wherein a second silicon source for depositing subsequent silicon layers after depositing the first silicon layer comprises a silicon compound selected from the group consisting of silanes having a silane chemical formula $Si_nH_{2n+2}$, where n =1 to 4, and halosilanes having a halosilane chemical formula $R_{4-x}SiH_x$, where R=Cl, Br or I and X=0 to 3.

6. The method of claim 5, wherein all silicon layers deposited after the first silicon layer are formed with the same second silicon source.

7. The method of claim 1, wherein a first substrate temperature for depositing the first silicon layer is less than about 525° C.

8. The method of claim 7, wherein the first substrate temperature is less than about 475° C.

9. The method of claim 8, wherein a second substrate temperature for reacting the first silicon layer is greater than the first substrate temperature.

10. The method of claim 9, wherein depositing and reacting are performed isothermally after reacting the first silicon layer.

11. The method of claim 10, wherein a third substrate temperature for depositing and reacting, after reacting the first silicon layer, is between about 400° C. and 650° C.

12. The method of claim 11, wherein the third substrate temperature is greater than about 525° C.

13. The method of claim 9, further comprising evacuating the reaction chamber for at least about 10 seconds before reacting the first silicon layer.

14. The method of claim 9, wherein the first silicon layer has a first silicon layer thickness of about 8-12 Å.

15. The method of claim 14, wherein a temperature and a duration for reacting are chosen to prevent reacting the substrate under the silicon layer.

16. The method of claim 14, wherein reacting the silicon layer comprises exposing the silicon layer to an atomic species.

17. The method of claim 16, wherein the atomic species is atomic nitrogen.

18. The method of claim 1, wherein the reaction chamber is a single substrate laminar flow reaction chamber.

19. The method of claim 1, wherein a temperature for reacting is less than about 650° C.

20. The method of claim 1, wherein a thickness of the first silicon layer on the substrate is about greater than or equal to a nitridation saturation depth.

* * * * *